(12) United States Patent
Kim et al.

(10) Patent No.: US 11,910,640 B2
(45) Date of Patent: Feb. 20, 2024

(54) DISPLAY DEVICE AND MANUFACTURING METHOD THEREOF

(71) Applicant: SAMSUNG DISPLAY CO., LTD., Yongin-si (KR)

(72) Inventors: Beom Shik Kim, Seoul (KR); Jae Joong Kwon, Suwon-si (KR); Hyun Jin Cho, Seoul (KR); Jeong Woo Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 256 days.

(21) Appl. No.: 17/391,313

(22) Filed: Aug. 2, 2021

(65) Prior Publication Data

US 2022/0037624 A1 Feb. 3, 2022

(30) Foreign Application Priority Data

Aug. 3, 2020 (KR) ........................ 10-2020-0096610

(51) Int. Cl.
*H10K 50/858* (2023.01)
*G02B 30/27* (2020.01)
*H10K 50/86* (2023.01)

(52) U.S. Cl.
CPC .......... *H10K 50/858* (2023.02); *G02B 30/27* (2020.01); *H10K 50/865* (2023.02)

(58) Field of Classification Search
CPC .... H10K 50/858; H10K 50/865; H10K 59/38; H10K 59/12; G02B 30/27; G02B 5/201; G02B 5/205; G02B 3/005; G02B 5/20
USPC .......................................................... 349/15
See application file for complete search history.

(56) References Cited

U.S. PATENT DOCUMENTS

| 6,064,424 | A | 5/2000 | Van Berkel et al. |
| 2016/0065954 | A1* | 3/2016 | Son ........................ G02B 30/52 348/51 |

FOREIGN PATENT DOCUMENTS

CN 104423052 3/2015

* cited by examiner

*Primary Examiner* — Charles S Chang
(74) *Attorney, Agent, or Firm* — F. CHAU & ASSOCIATES, LLC

(57) ABSTRACT

A display device includes a display panel, a lens array disposed on a first surface of the display panel and including a plurality of lenses, and an optical filter disposed on the first surface of the display panel. The optical filter includes a plurality of first portions and a plurality of second portions which are alternately arranged in a first direction parallel to the first surface of the display panel. Each of the plurality of first portions has a first transmittance value. Each of the plurality of second portions has a symmetric light transmittance distribution in which a transmittance value increases from the center having a second transmittance value to each of opposite ends having a third transmittance value.

22 Claims, 15 Drawing Sheets

Fig. 8
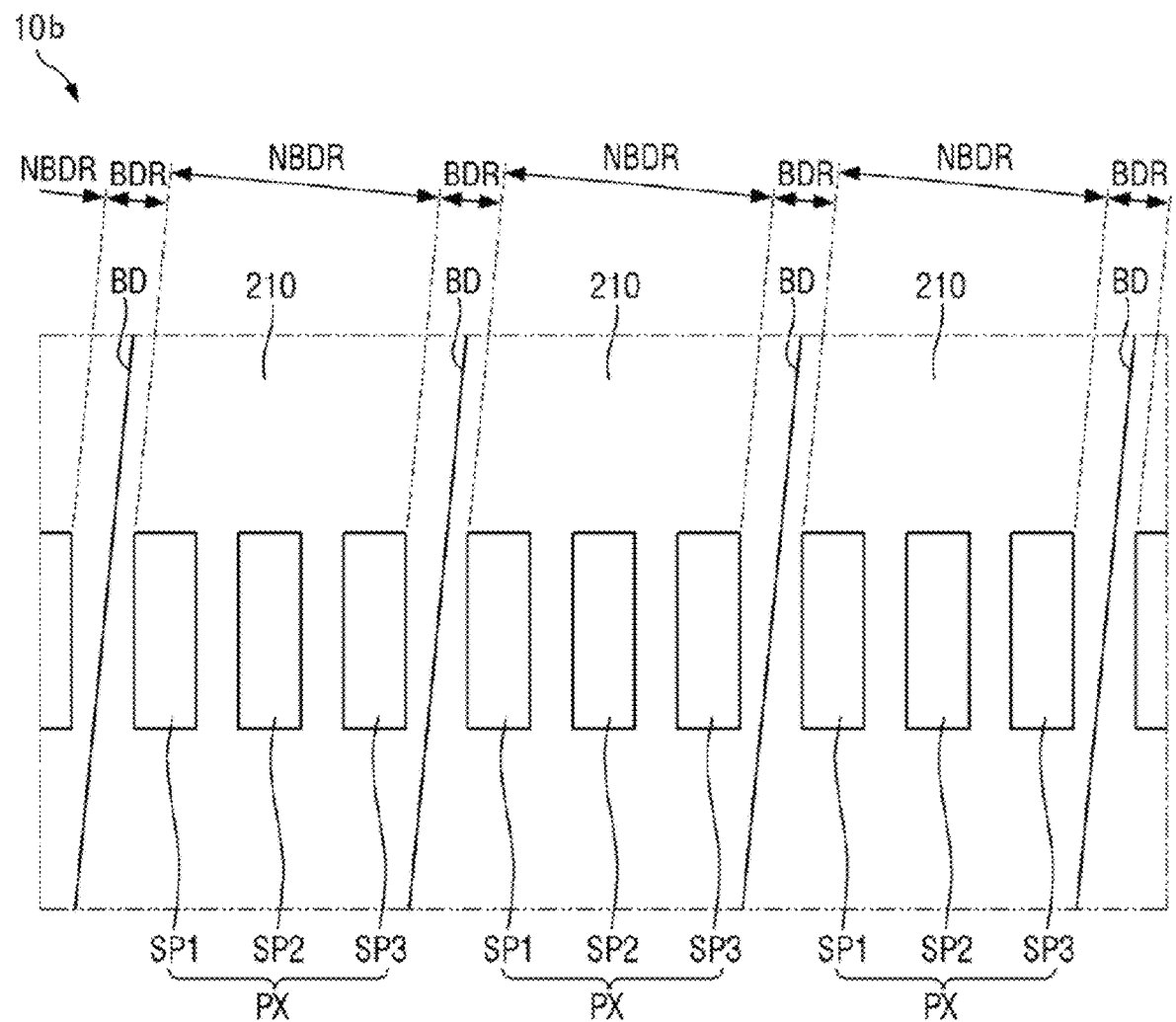
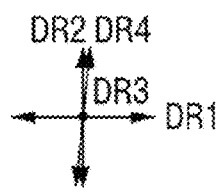

DISPLAY DEVICE AND MANUFACTURING METHOD THEREOF

CROSS-REFERENCE TO RELATED APPLICATION

This application claims priority from Korean Patent Application No. 10-2020-0096610 filed on Aug. 3, 2020 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a display device, more particularly to a display device having an optical filter with a light transmittance distribution, and a manufacturing method thereof.

2. Description of the Related Art

With the advance of information-oriented society, more and more demands are placed on display devices for displaying images in various ways. Various display devices such as a liquid crystal display (LCD) device, a plasma display panel (PDP) device, and an organic light emitting display (OLED) device have been used.

In recent years, a stereoscopic image display device and a viewing angle control display device, which divide and display an image of a display device in a space on the front surface of the display device using a lens array, have been developed. The stereoscopic image display device separately displays a left eye image and a right eye image to provide a three-dimensional effect according to binocular disparity. The viewing angle control display device separately displays a first viewing angle image and a second viewing angle image so that different images may be displayed from the display device to users located at different viewing angles.

SUMMARY

Aspects of the present disclosure provide a display device capable of reducing diffraction occurring at a boundary between lenses of a lens array.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment of the present invention, a display device includes a display panel, a lens array disposed on a first surface of the display panel and including a plurality of lenses, and an optical filter disposed on the first surface of the display panel. The optical filter includes a plurality of first portions and a plurality of second portions which are alternately arranged in a first direction parallel to the first surface of the display panel. Each of the plurality of first portions has a first transmittance value. Each of the plurality of second portions has a symmetric light transmittance distribution in which a transmittance value increases from the center having a second transmittance value to each of opposite ends having a third transmittance value.

According to an embodiment of the present invention, a display device includes a display panel, a lens array disposed on a first surface of the display panel and including a plurality of lenses, and an optical filter disposed on the first surface of the display panel and including a light blocking area overlapping a first lens boundary between two adjacent lenses of the plurality of lenses in a thickness direction, a light transmitting area disposed between the first lens boundary and a second lens boundary adjacent to the first lens boundary, and a gradient area disposed between the light blocking area and the light transmitting area. The gradient area of the optical filter has a light transmittance value which varies according to a distance from the first lens boundary toward the second lens boundary.

The display device and a manufacturing method thereof according to an embodiment can improve image quality by reducing diffraction occurring at the boundary of the lenses of the lens array.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail exemplary embodiments thereof with reference to the attached drawings, in which:

FIG. 8 is a plan view conceptually illustrating a plurality of lenses and pixels of the display device of FIG. 7 according to an embodiment of the present invention;

DETAILED DESCRIPTION OF THE EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it may be directly on the other layer or substrate, or intervening layers may also be present. In contrast, when an element is referred to as being "directly on" another element, there are no intervening elements present.

Hereinafter, specific exemplary embodiments will be described with reference to the accompanying drawings.

Figure 1:
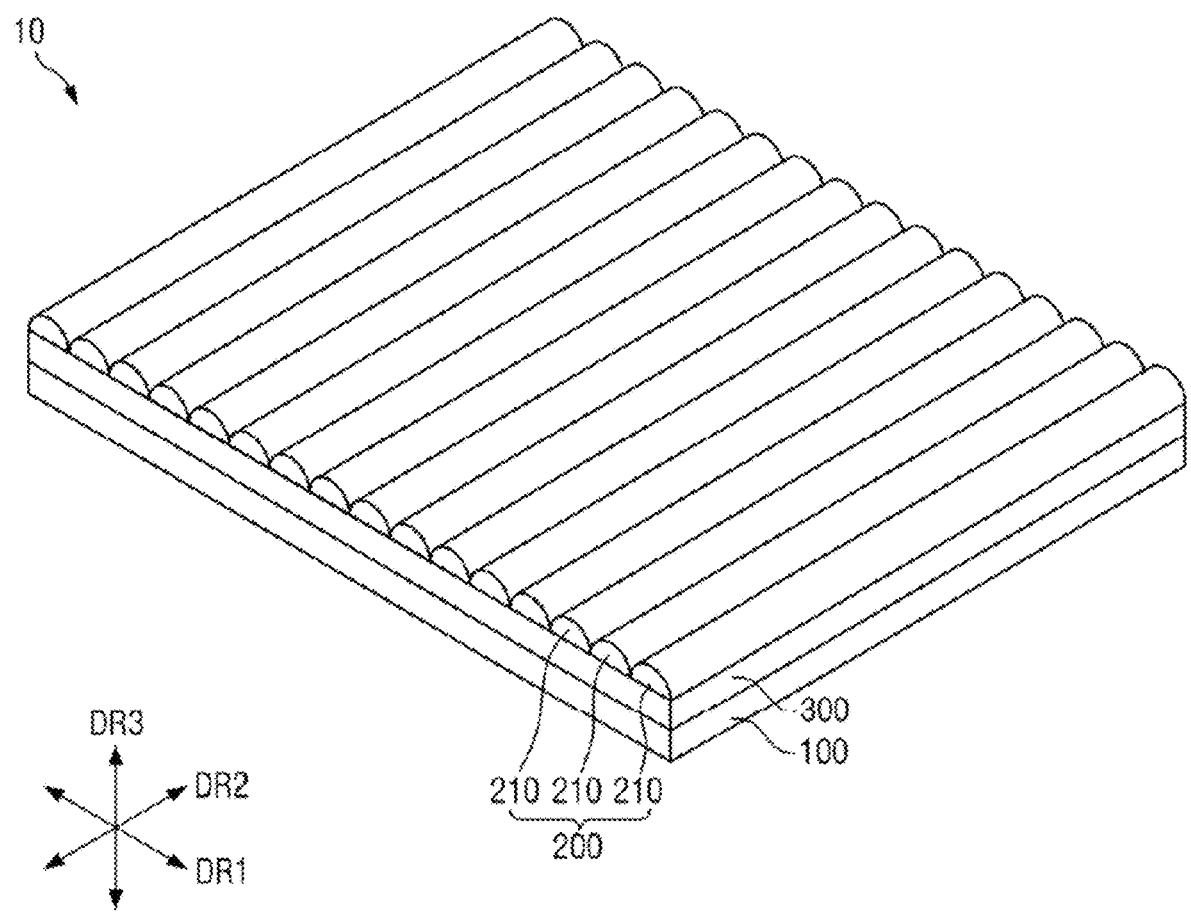
FIG. 1 is a perspective view of a display device according to an embodiment of the present invention.

FIG. 1 is a perspective view of a display device according to an embodiment.

Hereinafter, a first direction DR1, a second direction DR2, and a third direction DR3 cross each other in different directions. In an embodiment, the first direction DR1, the second direction DR2, and the third direction DR3 may intersect at a right angle. The first direction DR1 may be a horizontal direction, the second direction DR2 may be a vertical direction, and the third direction DR3 may be a thickness direction. The first direction DR1, the second direction DR2, and/or the third direction DR3 may include two or more directions. For example, the third direction DR3 may include an upward direction toward the upper side of the drawing and a downward direction toward the lower side of the drawing. One surface of a member that is oriented in the upward direction may be referred to as a top surface, and the other surface of the member that is oriented in the downward direction may be referred to as a bottom surface. However, the directions refer to relative and example directions, and are not limited to the aforementioned examples.

Referring to FIG. 1, a display device 10 may include a display panel 100, a lens array 200, and an optical filter 300.

The display device 10 may be a stereoscopic image display device or a viewing angle control display device that divides and displays an image, which is displayed on the display panel 100 using the lens array 200, in a space on the front surface of the display device 10. The stereoscopic image display device or the viewing angle control display device may include a light field display device that has a member such as a barrier or a lenticular lens arranged on the display panel 100 so as to input different image information to the eyes of a viewer. For example, when the display device 10 is the stereoscopic image display device, a left eye image and a right eye image may be separately displayed in the space on the front surface of the display device 10 to provide a three-dimensional effect according to binocular disparity. When the display device 10 is the viewing angle control display device, a first viewing angle image and a second viewing angle image may be separately displayed in the space on the front surface of the display device 10 so that different images may be displayed from the display device 10 to users located at different viewing angles.

The display panel 100 may be a light emitting display panel including a light emitting element. For example, the display panel 100 may be an organic light emitting display panel using an organic light emitting diode including an organic light emitting layer, a micro light emitting diode display panel using a micro LED, a quantum dot light emitting display panel using a quantum dot light emitting diode including a quantum dot light emitting layer, or an inorganic light emitting display panel using an inorganic light emitting element including an inorganic semiconductor. The following description is directed to the case where the display panel 100 is an organic light emitting display panel.

The display panel 100, when is viewed in a plan view, may have a rectangular shape. The display panel 100 may have long sides in the first direction DR1 and short sides in the second direction DR2. A corner where the long side in the first direction DR1 and the short side in the second direction DR2 meet each other may be right-angled or rounded with a predetermined curvature. The planar shape of the display panel 100 is not limited to a rectangular shape, and may be a shape similar to another polygonal shape, a circular shape, or an elliptical shape.

The display panel 100 may include data lines, scan lines, and a plurality of sub-pixels connected to the data lines and the scan lines to display an image. Each of the sub-pixels may be connected to at least one scan line and at least one data line. Each of the sub-pixels may include a thin film transistor such as a driving transistor and at least one switching transistor, and a light emitting element. Each of the sub-pixels may receive a data voltage of the data line when a scan signal is applied from the scan line, and supply a driving current to the light emitting element according to the data voltage applied to the gate electrode of the driving transistor, thereby emitting light.

The lens array 200 may be disposed above a first surface of the display panel 100. The present invention is not limited thereto. In an example embodiment, the lens array 200 is in contact with the first surface of the display panel 100. This configuration will be described with reference to FIG. 13.

The lens array 200 may include a plurality of lenses 210. Each of the lenses 210 may be a semi-cylindrical lens which extends in the second direction DR2. Each of the lenses 210 may have a semicircular cross section. The present invention is not limited thereto. For example, the lenses 210 may be Fresnel lenses.

The optical filter 300 is disposed between the display panel 100 and the lens array 200. The optical filter 300 may have a light transmittance (i.e., a light transmittance value) that is varied according to a distance from the boundary between two adjacent lenses of the lenses 210. The optical filter 300 may serve to reduce the amount of diffraction of light emitted from the lens array 200. A detailed description thereof will be given later.

Figure 2:
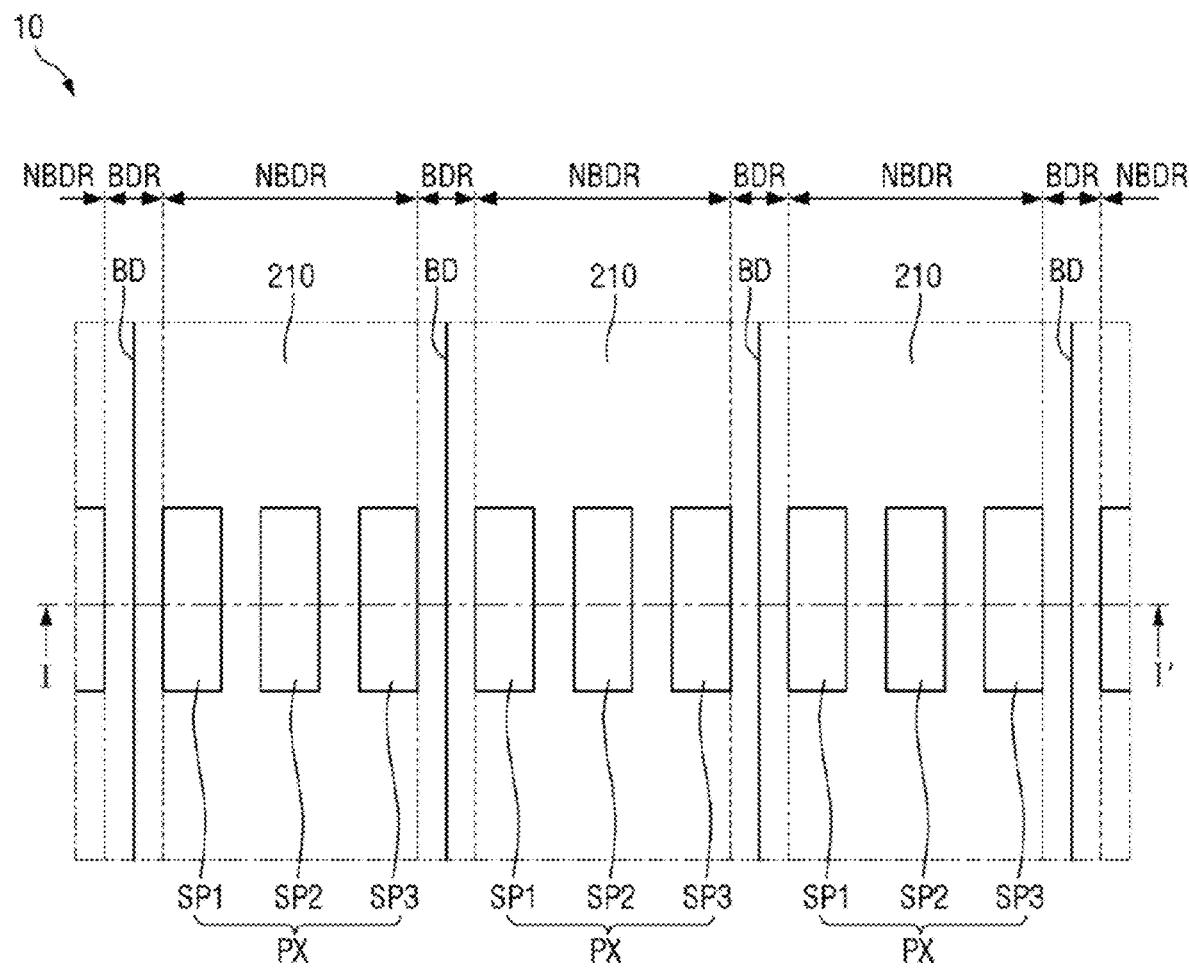
FIG. 2 is a plan view conceptually illustrating a plurality of lenses and pixels of a display device according to an embodiment of the present invention.
Figure 3:
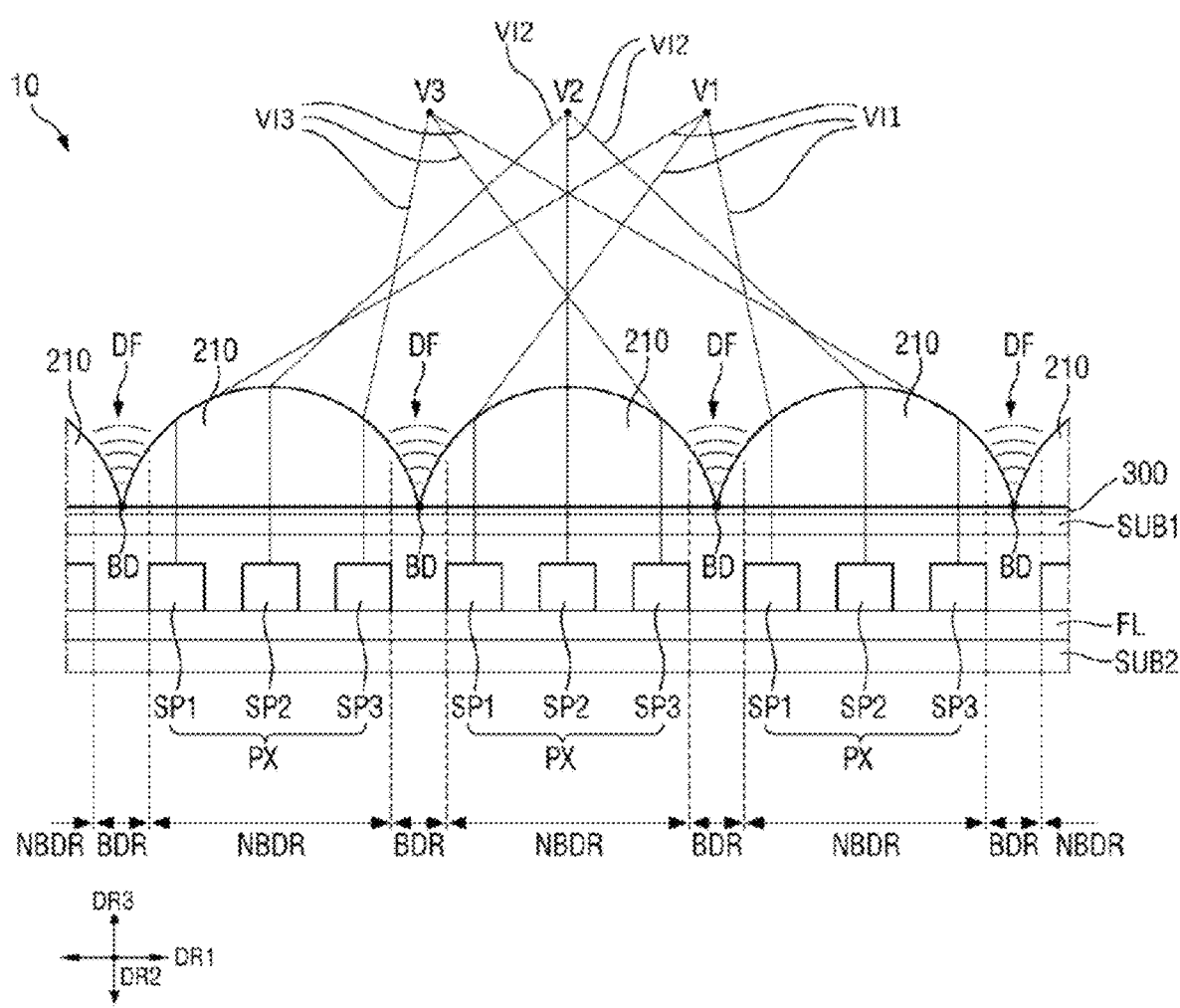
FIG. 3 is a cross-sectional view conceptually illustrating a method of implementing a stereoscopic image and viewing angle control of a display device according to an embodiment of the present invention.

FIG. 2 is a plan view conceptually illustrating a plurality of lenses and pixels of a display device according to an embodiment. FIG. 3 is a cross-sectional view conceptually illustrating a method of implementing a stereoscopic image and viewing angle control of a display device according to an embodiment.

In FIG. 2, for convenience of description, three pixels PX of the display panel 100 and three lenses 210 are only illustrated, and the optical filter 300 is omitted.

For convenience of description, FIG. 3 illustrates only three pixels PX of the display panel 100, three lenses 210, a first substrate SUB1, a filler FL, a second substrate SUB2, and the optical filter 300.

Referring to FIGS. 2 and 3, the first substrate SUB1 may include or may be formed of an organic polymer material such as polyethylene, polyimide, polycarbonate, polysulfone, polyacrylate, polystyrene, polyvinyl chloride, polyvinyl alcohol, polynorbornene, and polyester.

A plurality of pixels PX may be disposed on one surface of the first substrate SUB1. Each of the plurality of pixels PX may include a first sub-pixel SP1, a second sub-pixel SP2, and a third sub-pixel SP3. The pixel PX may be defined as a group of the sub-pixels SP1, SP2, and SP3 for expressing a white level. Each of the sub-pixels SP1, SP2, and SP3 may be defined as a minimum unit capable of expressing a gray level.

The first sub-pixel SP1 may emit light of a first color, the second sub-pixel SP2 may emit light of a second color, and the third sub-pixel SP3 may emit light of a third color. The first color may be red, the second color may be green, and the third color may be blue, but the present invention is not limited thereto.

Each of the first, second, and third sub-pixels SP1, SP2, and SP3 may have a rectangular shape, in a plan view, having short sides in the first direction DR1 and long sides in the second direction DR2. The term "in a plan view" may refer to "when the display device is viewed in a plan view." In an embodiment, the first, second, and third sub-pixels SP1, SP2, and SP3 are repeatedly arranged in the first direction DR1 in the order of the first sub-pixel SP1, the second sub-pixel SP2, and the third sub-pixel SP3.

The second substrate SUB2 may be disposed on the first substrate SUB1 which is provided with the plurality of pixels PX. The second substrate SUB2 may include or may be formed of glass, or an organic polymer resin such as polyethylene, polyimide, polycarbonate, polysulfone, polyacrylate, polystyrene, polyvinyl chloride, polyvinyl alcohol, polynorbornene, and polyester.

The filler FL may be disposed between the first substrate SUB1 which is provided with the plurality of pixels PX, and the second substrate SUB2. The filler FL may be made of a material having a buffering function. For example, the filler FL may be formed of an organic layer such as acryl resin, epoxy resin, phenolic resin, polyamide resin, polyimide resin and the like.

The optical filter 300 may be disposed on the other surface of the first substrate SUB1, which is opposite to one surface of the first substrate SUB1 which is in contact with the filler FL. The optical filter 300 may be disposed between the first substrate SUB1 and the lens array 200. One surface of the optical filter 300 may be in contact with the other surface of the first substrate SUB1, and the other surface of the optical filter 300 may be in contact with one surface of the lens array 200.

The plurality of lenses 210 may be arranged on the other surface of the optical filter 300. The lenses 210 may extend in the second direction DR2. In an embodiment, the first, second and third sub-pixels SP1, SP2, and SP3 may be repeatedly arranged in the first direction DR1 in that order, and the lenses 210 may extend in the second direction DR2 intersecting the first direction DR1. The second direction DR2 may be perpendicular to the first direction DR1. The lenses 210 may be disposed to be parallel with the respective long sides of the sub-pixels SP1, SP2, and SP3, which extend in the second direction DR2.

Although FIGS. 2 and 3 illustrate that three sub-pixels SP1, SP2, and SP3 are disposed to overlap one lens in the thickness direction (i.e., the third direction D3), the number of the sub-pixels SP1, SP2, and SP3 overlapping one lens is not limited thereto.

Each of the first sub-pixels SP1 may be disposed adjacent to a first side of each lens 210, each of the second sub-pixels SP2 may be disposed at the center of each lens 210, and each of the third sub-pixels SP3 may be disposed adjacent to a second side of each lens 210. For example, as shown in FIGS. 2 and 3, the first side of the lens 210 may be the left side of the lens 210, and the second side of the lens 210 may be the right side of the lens 210.

The first sub-pixels SP1, the second sub-pixels SP2, and the third sub-pixels SP3 may respectively provide a first view image VI1, a second view image VI2, and a third view image VI3. The first view image VI1, the second view image VI2, and the third view image VI3 may be respectively displayed from the first sub-pixels SP1, the second sub-pixels SP2, and the third sub-pixels SP3 toward spaces separated from each other on the front surface of the display device 10. The first, second and third view images VI1, VI2, and VI3 may be refracted by the lenses 210 and respectively provided to a first view region V1, a second view region V2, and a third view region V3 of the display device 10. For example, as illustrated in FIG. 3, the second view region V2 may be located in a center region of the display device 10, and the first view region V1 may be located in the right region of the display device 10, and the third view region V3 may be located in the left region of the display device 10.

The first, second and third view images VI1, VI2, and VI3 may be generated in consideration of binocular disparity. When the user's left and right eyes are on different view regions among the first, second and third view regions V1, V2, and V3, the user may feel a three-dimensional effect due to the binocular disparity.

The first, second and third view images VI1, VI2, and VI3 may be different images from each other. For example, when the display device 10 is applied to a vehicle display, the first view image VI1 may be a navigation image, the second view image VI2 may be an image representing vehicle information, and the third view image VI3 may be an entertainment image such as a movie. A user located in the first view region V1 may see only the navigation image, a user located in the second view region V2 may see only the image representing the vehicle information, and a user located in the third view region V3 may see only the entertainment image. The display device 10 may show different images to users located at different viewing angles.

For convenience of description, FIGS. 2 and 3 illustrate that three view images VI1, VI2, and VI3 are provided to three view regions V1, V2, and V3 from the first, second and third sub-pixels SP1, SP2, and SP3, but the present disclosure is not limited thereto. The number of sub-pixels, the number of view images, and the number of view regions may be appropriately determined according to the size of the display device 10 and which of the stereoscopic image and the viewing angle control image is provided by the display device 10.

The lens array 200 may include a lens boundary portion BDR and a non-boundary portion NBDR. The lens boundary portion BDR may be provided in plural, and the non-boundary portion NBDR may be provided in plural. In an example embodiment, the plurality of lens boundary portions BDR and the plurality of non-boundary portions NBDR are alternately arranged in the first direction DR1.

The lens boundary portion BDR may be disposed to overlap a lens boundary BD. The lens boundary BD may be a line and/or a point serving as a reference for distinguishing each of the lenses 210 constituting the lens array 200. In an embodiment, the lens boundary BD may have a straight linear shape extending in the second direction DR2 in a plan view.

The lens boundary portion BDR may include a portion of the lens 210 adjacent to the lens boundary BD. The lens boundary portion BDR may include edge portions of two adjacent lenses 210. The lens boundary BD may correspond to where the two adjacent lenses 210 meet each other. The plurality of the lens boundary portions BDR may be disposed for the plurality of lens boundaries BD, and the lens boundary portions BDR disposed at different lens boundaries BD may be spaced apart from each other in the first direction DR1.

As shown in FIG. 2, the lens boundary portions BDR may be arranged in the shape of stripes extending in the second direction DR2 in a plan view. The lens boundary portion BDR may have a predetermined width in the first direction DR1. The predetermined width may be the pitch of the lens 210. For example, the predetermined width may be between about one-hundredth and one-tenth of the width of one lens 210 in the first direction DR1. For another example, the predetermined width may be between about 3 μm and 5 μm. The width of one lens 210 in the first direction DR1 may be between about 100 μm and 140 μm. For still another example, the lens boundary portion BDR may have a width of about 2 μm from the lens boundary BD to the left side of FIG. 2 and a width of about 2 μm from the lens boundary BD to the right side of FIG. 2.

Each of the plurality of non-boundary portions NBDR may be disposed between two adjacent lens boundaries BD or two adjacent lens boundary portions BDR. In one lens 210, the non-boundary portion NBDR may be the central portion of the lens 210, and two lens boundary portions BDR may be positioned on opposite sides of the non-boundary portion NBDR. Each of the two lens boundary portions BDR may overlap a corresponding lens boundary BD. As shown in FIG. 2, the non-boundary portions NBDR may be arranged in the shape of stripes extending in the second direction DR2 in a plan view. The width of the non-boundary portion NBDR in the first direction DR1 may be greater than the width of the lens boundary portion BDR in the first direction DR1.

Referring to FIG. 3, when the plurality of lenses 210 are disposed, diffraction DF may occur at the lens boundary portion BDR. Due to the diffraction DF, light from the display panel 100 may be emitted in an undesired direction. Accordingly, crosstalk between different images may occur between lights emitted from the sub-pixels SP1, SP2, and SP3, thereby deteriorating the image quality of the view images VI1, VI2, and VI3. Such image quality deterioration may be reduced by the optical filter 300 which will be described later.

Figure 4:
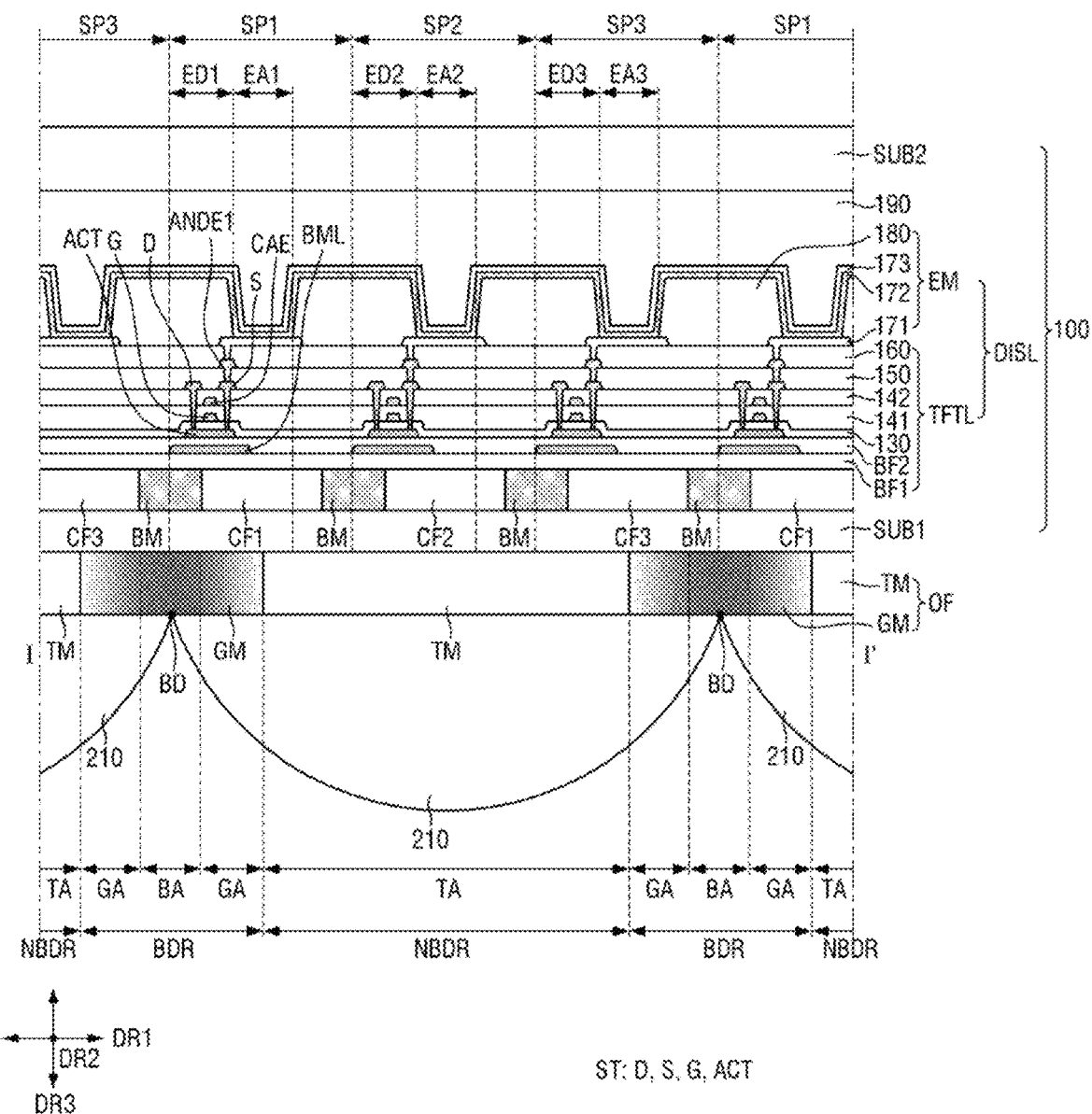
FIG. 4 is a cross-sectional view of a display device according to an embodiment of the present invention.
Figure 5:
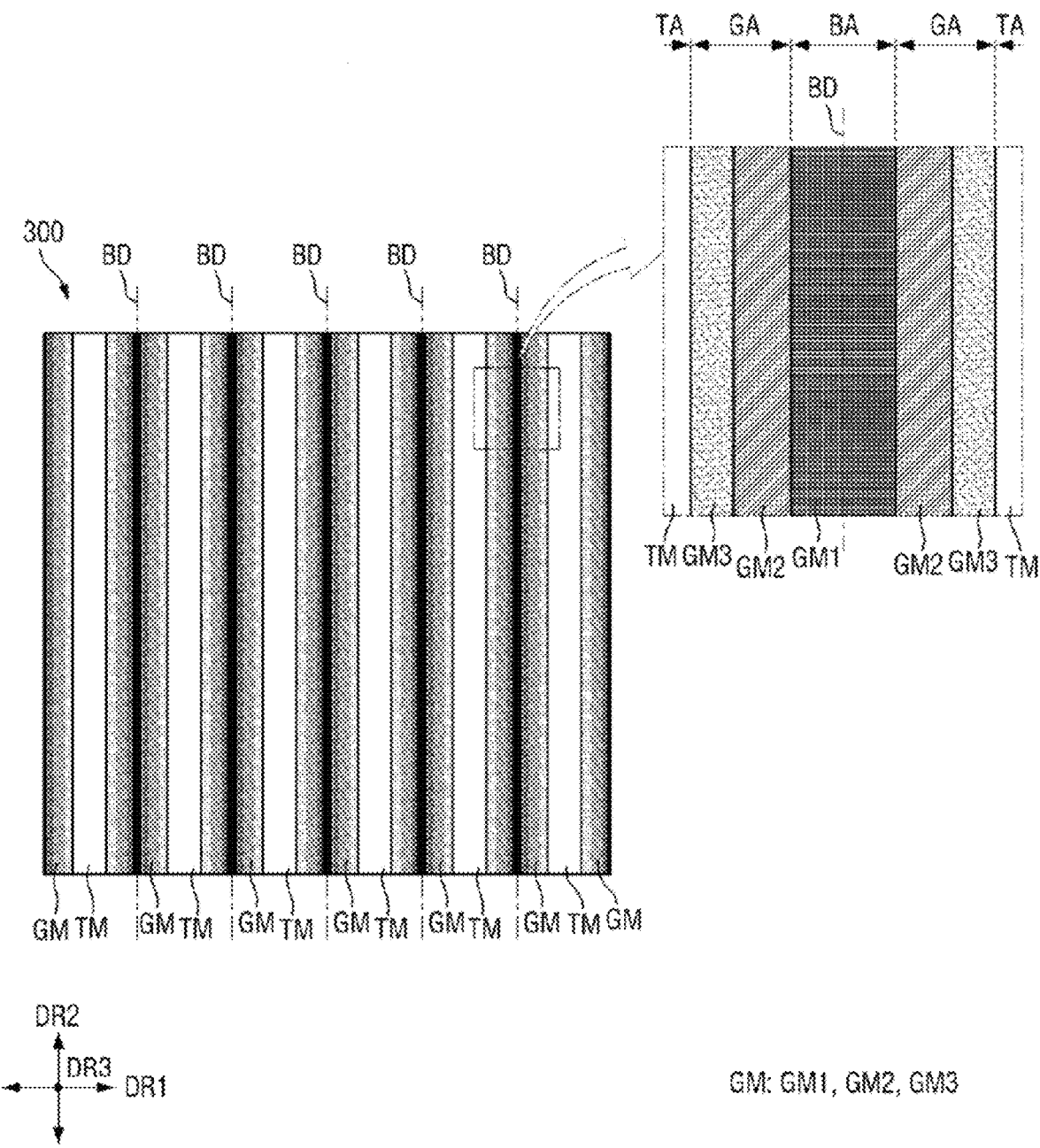
FIG. 5 is a plan view of an optical filter of a display device according to an embodiment of the present invention.

FIG. 4 is a cross-sectional view of a display device according to an embodiment. FIG. 5 is a plan view of an optical filter of a display device according to an embodiment.

FIG. 4 illustrates a bottom emission type display device 10 as an example of the display device 10. A structure, in which color filters CF1, CF2, and CF3 are disposed under the display panel 100 (under a light emitting element layer EML), and the optical filter 300 and the lens array 200 are sequentially disposed thereunder, is illustrated. However, this is only one application example, and a top emission type display device may be applied as the display device 10. For example, the color filters CF1, CF2, and CF3 are located on the second substrate SUB2, and the optical filter 300 and the lens array 200 are sequentially stacked above one surface of the second substrate SUB2.

Referring to FIG. 4, the display device 10 may include the lens array 200, the optical filter 300 arranged on one surface of the lens array 200, and the display panel 100 arranged on one surface of the optical filter 300.

The display panel 100 may include the first substrate SUB1, the second substrate SUB2, and a pixel array layer DISL. The pixel array layer DISL may include a thin film transistor layer TFTL and the light emitting element layer EML.

The first substrate SUB1 may be disposed on one surface of the optical filter 300. The color filters CF1, CF2, and CF3 and a black matrix BM may be disposed on one surface of the first substrate SUB1, which faces the second substrate SUB2.

The first color filter CF1 may be a first color light transmissive filter that transmits light of a first color, the second color filter CF2 may be a second color light transmissive filter that transmits light of a second color, and a third color filter CF3 may be a third color light transmissive filter that transmits light of the third color. For example, the first color may be red, the second color may be green, and the third color may be blue. Red light having passed through the first color filter CF1 may have a peak wavelength in a range of about 620 to 750 nm, green light having passed through the second color filter CF2 may have a peak wavelength in a range of about 500 to 570 nm, and blue light having passed through the third color filter CF3 may have a peak wavelength in a range of about 450 to 490 nm.

The first color filter CF1 may overlap a first emission area EA1 of the first sub-pixel SP1 in the third direction DR3, and light emitted from the first emission area EA1 may be outputted as the light of the first color by the first color filter CF1. The second color filter CF2 may overlap a second emission area EA2 of the second sub-pixel SP2 in the third direction DR3, and light emitted from the second emission area EA2 may be outputted as the light of the second color by the second color filter CF2. The third color filter CF3 may overlap a third emission area EA3 of the third sub-pixel SP3 in the third direction DR3, and light emitted from the third emission area EA3 may be outputted as the light of the third color by the third color filter CF3.

The black matrix BM may include a material capable of blocking and/or absorbing light. For example, the black matrix BM may be formed of an organic layer including a black dye or a black pigment, or may be formed of a metal layer including an opaque metal material such as chromium (Cr). The black matrix BM may be disposed between two adjacent color filters. The black matrix BM may prevent light of one sub-pixel from traveling to a color filter other than a color filter overlapping the one sub-pixel in the third direction DR3.

FIG. 4 illustrates that the color filters CF1, CF2, and CF3 and the black matrix BM are disposed between the first substrate SUB1 and a first buffer layer BF1, but the arrangement positions of the color filters CF1, CF2 and CF3, and the black matrix BM are not limited thereto. The color filters CF1, CF2, and CF3 and the black matrix BM may be disposed between a first organic layer 150 and a second organic layer 160, or may be disposed instead of the first organic layer 150. In an embodiment, the black matrix BM may be provided in plural. For example, the plurality of black matrixes BM and the plurality of color filters CF1, CF2, and CF3 may be alternately arranged in the first direction DR1. The plurality of black matrixes BM may include a plurality of first black matrixes and a plurality of second black matrixes. Each of the plurality of first black matrixes may overlap, in the thickness direction, a corresponding one of a plurality of gradient light blocking members GM, which will be described later, of the optical filter 300. Each of the plurality of second black matrixes may overlap, in the thickness direction, a corresponding one of the plurality of light transmitting members TM, which will be described later, of the optical filter 300.

The first buffer layer BF1 may be disposed on the color filters CF1, CF2, and CF3 and the black matrix BM, and a second buffer layer BF2 may be disposed on the first buffer layer BF1. The first and second buffer layers BF1 and BF2 serve to protect thin film transistors of the thin film transistor layer TFTL and a light emitting layer 172 of the light emitting element layer EML from moisture permeating through the first substrate SUB1 which is susceptible to moisture permeation. Each of the first and second buffer layers BF1 and BF2 may be formed of multiple layers in which one or more inorganic layers of a silicon nitride layer, a silicon oxynitride layer, a silicon oxide layer, a titanium oxide layer and an aluminum oxide layer are alternately stacked. At least one of the first and second buffer layers BF1 and BF2 may be omitted.

A first light blocking layer BML may be disposed on the first buffer layer BF1. The first light blocking layer BML may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. Alternatively, the first light blocking layer BML may be an organic layer including a black pigment.

An active layer ACT of a thin film transistor ST may be disposed on the second buffer layer BF2. The active layer ACT may include polycrystalline silicon, monocrystalline silicon, low-temperature polycrystalline silicon, amorphous silicon, or an oxide semiconductor material. In the case where the active layer ACT includes polycrystalline silicon or an oxide semiconductor material, an ion-doped region of the active layer ACT may be a conductive region having conductivity.

The active layer ACT may overlap the first light blocking layer BML in the third direction DR3 (Z-axis direction). Since light incident through the substrate SUB1 may be blocked by the first light blocking layer BML, it is possible to prevent a leakage current from flowing through the active layer ACT by light incident through the substrate SUB1.

A gate insulating layer 130 may be formed on the active layer ACT of the thin film transistor ST. The gate insulating layer 130 may be formed of an inorganic layer, for example, a silicon nitride layer, a silicon oxynitride layer, a silicon oxide layer, a titanium oxide layer, or an aluminum oxide layer.

A gate electrode G of the thin film transistor ST may be arranged on the gate insulating layer 130. The gate electrode G of the thin film transistor ST may overlap the active layer ACT in the third direction DR3 (Z-axis direction). A portion of the active layer ACT, which overlaps the gate electrode G in the third direction DR3 (Z-axis direction), may be a channel region CHA. The gate electrode G may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A first interlayer insulating layer 141 may be disposed on the gate electrode G. The first interlayer insulating layer 141 may be formed of an inorganic layer, for example, a silicon nitride layer, a silicon oxynitride layer, a silicon oxide layer, a titanium oxide layer, or an aluminum oxide layer. The first interlayer insulating layer 141 may include a plurality of inorganic layers.

A capacitor electrode CAE may be disposed on the first interlayer insulating layer 141. The capacitor electrode CAE may overlap the gate electrode G in the third direction DR3 (Z-axis direction). The capacitor electrode CAE may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A second interlayer insulating layer 142 may be disposed on the capacitor electrode CAE. The second interlayer insulating layer 142 may be formed of an inorganic layer, for example, a silicon nitride layer, a silicon oxynitride layer, a silicon oxide layer, a titanium oxide layer, or an aluminum oxide layer. The second interlayer insulating layer 142 may include a plurality of inorganic layers.

The thin film transistor ST may have a first electrode S and a second electrode D arranged on the second interlayer insulating layer 142. The first electrode S and the second electrode D may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The first electrode S of the thin film transistor ST may be connected to a first conductive area COA1 arranged at one side of the channel region CHA of the active layer ACT through a contact hole that penetrates the gate insulating layer 130, the first interlayer insulating layer 141, and the second interlayer insulating layer 142. The second electrode D of the thin film transistor ST may be connected to a second conductive area COA2 arranged at the other side of the channel region CHA of the active layer ACT through a contact hole that penetrates the gate insulating layer 130, the first interlayer insulating layer 141, and the second interlayer insulating layer 142.

The first organic layer 150 may be disposed on the first electrode S and the second electrode D to planarize stepped portions due to the thin film transistors. The first organic layer 150 may be formed of an organic layer such as acryl resin, epoxy resin, phenolic resin, polyamide resin, polyimide resin and the like.

A first connection electrode ANDE1 may be disposed on the first organic layer 150. The first connection electrode ANDE1 may be connected to the second electrode D of the thin film transistor ST through a contact hole penetrating the first organic layer 150. The first connection electrode ANDE1 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The second organic layer 160 may be disposed on the first connection electrode ANDE1. The second organic layer 160 may be formed of an organic layer such as acryl resin, epoxy resin, phenolic resin, polyamide resin, polyimide resin and the like.

Although FIG. 4 illustrates that the thin film transistor ST is formed by a top gate structure in which the gate electrode G is located above the active layer ACT, the present disclosure is not limited thereto. The thin film transistor ST may be formed by a bottom gate structure in which the gate electrode G is located below the active layer ACT, or a double gate method in which the gate electrode G is located both above and below the active layer ACT.

The light emitting element layer EML is disposed on the thin film transistor layer TFTL. The light emitting element layer EML may include light emitting elements 170 and a bank 180. Each of the light emitting elements 170 may include a first electrode 171, a light emitting layer 172, and a second electrode 173.

The sub-pixels SP1, SP2, and SP3 may include the emission areas EA1, EA2, and EA3 and emission drivers ED1, ED2, and ED3, respectively. The first sub-pixel SP1 may include the first emission area EA1 and the first emission driver ED1. The second sub-pixel SP2 may include the second emission area EA2 and the second emission driver ED2. The third sub-pixel SP3 may include the third emission area EA3 and the third emission driver ED3.

Each of the emission drivers ED1, ED2, and ED3 may include at least one thin film transistor ST. Each of the emission areas EA1, EA2, and EA3 represents an area in which the first electrode 171, the light emitting layer 172, and the second electrode 173 are sequentially stacked, and holes from the first electrode 171 and electrons from the second electrode 173 are combined with each other in the light emitting layer 172 to emit light. The first electrode 171 may be an anode electrode, and the second electrode 173 may be a cathode electrode.

The first electrode 171 may be formed on the second organic layer 160. The first electrode 171 may be connected to the first connection electrode ANDE1 through a contact hole penetrating the second organic layer 160.

In a bottom emission structure in which light is emitted toward the second electrode 173 when viewed with respect to the light emitting layer 172, the first electrode 171 may be formed of a transparent conductive material (TCO) such as ITO or IZO capable of transmitting light, or a semi-transmissive conductive material such as magnesium (Mg), silver (Ag), or an alloy of magnesium (Mg) and silver (Ag). When the first electrode 171 is formed of a semi-transmissive conductive material, the light emission efficiency may increase due to a micro-cavity effect.

The bank 180 serves to define the emission areas EA1, EA2, and EA3 of the display pixels. To this end, the bank 180 may be formed on the second organic layer 160 to expose a portion of the first electrode 171. The bank 180 may cover the edge of the first electrode 171. first electrode 171 may be disposed on a contact hole that penetrates the second organic layer 160. Accordingly, the contact hole penetrating the second organic layer 160 may be filled with the first electrode 171. The bank 180 may be formed of an organic layer such as acryl resin, epoxy resin, phenolic resin, polyamide resin, polyimide resin and the like.

The light emitting layer 172 is formed on the first electrode 171 and the bank 180. The light emitting layer 172 may be a common layer commonly formed on the sub-pixels SP1, SP2, and SP3. The light emitting layer 172 may include an organic material to emit light in a predetermined color. For example, the light emitting layer 172 may include a hole transporting layer, an organic material layer, and an electron transporting layer. The organic material layer may include a host and a dopant. The organic material layer may include a material that emits predetermined light, and may be formed using a phosphorescent material or a fluorescent material. In some embodiments, the organic material layer may be formed to be separated for each pixel. The organic material layer may include a material emitting light of a different color for each color pixel, but is not limited thereto, and may emit light of the same color (e.g., white).

The second electrode 173 is formed on the light emitting layer 172. The second electrode 173 may be formed to cover the light emitting layer 172. The second electrode 173 may be a common layer commonly formed on the sub-pixels SP1, SP2, and SP3. A capping layer may be formed on the second electrode 173.

The second electrode 173 may be formed of a single layer of molybdenum (Mo), titanium (Ti), copper (Cu), or aluminum (Al) in the bottom emission structure, or may be formed to have a stacked structure (Ti/Al/Ti) of aluminum and titanium, a stacked structure (ITO/Al/ITO) of aluminum and indium tin oxide (ITO), an APC alloy, or a stacked structure (ITO/APC/ITO) of APC alloy and ITO to increase the reflectivity. The APC alloy is an alloy of silver (Ag), palladium (Pd) and copper (Cu).

Since the first electrode 171 is formed of a transparent conductive material (e.g., transparent conductive oxides (TCO)) or a semi-transmissive conductive material, which is capable of transmitting light, and the second electrode 173 is formed of an opaque metal material having a high reflectivity, light from the light emitting layer 172 may be emitted toward the first substrate SUB1. Each of the light emitting elements 170 may have the bottom emission structure in which light is emitted in the downward direction.

An encapsulation layer 190 is formed on the light emitting element layer EML. The encapsulation layer 190 serves to prevent permeation of oxygen or moisture into the light emitting layer 172 and the cathode electrode 173. To this end, the encapsulation layer 190 may include at least one inorganic layer. The inorganic layer may be formed of silicon nitride, aluminum nitride, zirconium nitride, titanium nitride, hafnium nitride, tantalum nitride, silicon oxide, aluminum oxide, or titanium oxide. The encapsulation layer 190 may further include at least one organic layer. The organic layer may be formed to have a thickness sufficient to prevent particles from penetrating the encapsulation layer 190 and being injected into the light emitting layer 172 and the cathode electrode 173. The organic layer may include any one of epoxy, acrylate, and urethane acrylate.

The filler FL may be disposed between the encapsulation layer 190 and the second substrate SUB2. The filler FL may be made of a material having a buffering function. For example, the filler FL may be formed of an organic layer such as acryl resin, epoxy resin, phenolic resin, polyamide resin, polyimide resin and the like.

A sealing material (not shown) for bonding the first substrate SUB1 and the second substrate SUB2 may be provided in the peripheral area between the first substrate SUB1 and the second substrate SUB2. The filler FL may be surrounded by the sealing material in a plan view. The sealing material may be a glass frit or a sealant.

Referring to FIGS. 4 and 5, as described above, the optical filter 300 may be disposed between the lens array 200 and the display panel 100.

The optical filter 300 may include a light transmitting area TA, a gradient area GA, and a light blocking area BA.

The light transmitting area TA, the gradient area GA, and the light blocking area BA may be respectively disposed within a first distance range, a second distance range, and a third distance range from the lens boundary BD. The first distance range may be greater than the second distance range and the third distance range, and the second distance range may be greater than the third distance range.

The light transmitting area TA may transmit most of light incident from the display panel 100.

The light blocking area BA may block or absorb most of light incident from the display panel 100. The light blocking area BA may be disposed between the light transmitting areas TA. The light blocking area BA may be disposed to overlap the lens boundary BD in the thickness direction. The light blocking area BA may overlap the black matrix BM in the thickness direction. In an example embodiment, the black matrix BM is provided in plural. The plurality of black matrixes BM may include a plurality of first black matrixes and a plurality of second black matrixes. Each of the plurality of first black matrixes may overlap a corresponding lens boundary BD and the light blocking area BA in the thickness direction, and each of the plurality of second black matrixes may overlap a corresponding light transmitting area TA. The width of the light blocking area BA in the first direction DR1 may be smaller than that of the light transmitting area TA.

The gradient area GA is an area in which a light transmittance (i.e., a light transmittance value), a light blocking ratio, and/or light absorption gradually varies according to a distance from the lens boundary BD. In an example embodiment, the gradient area GA may have a light transmittance distribution in the first direction DR1. Hereinafter, for convenience of description, the light transmittance will be mainly described, but it is obvious that the following description of the light transmittance may be applied in reverse to the light blocking ratio and/or the light absorption. The gradient area GA may be disposed between the light transmitting area TA and the light blocking area BA. The gradient area GA may be connected to the light transmitting area TA and the light blocking area BA. In a cross-sectional view of the display device 10, one light blocking area BA overlapping the boundary BD of one lens 210 may be disposed, and two gradient areas GA may be disposed on opposite sides of the one light blocking area BA. The light transmittance of the gradient area GA may increase farther away from the lens boundary BD. For example, the light transmittance of the gradient area GA may be minimum at an edge portion adjacent to the lens boundary BD and/or light blocking area BA, and may be maximum at an edge portion adjacent to the light transmitting area TA. The width of the gradient area GA in the first direction DR1 may be smaller than that of the light transmitting area TA. The width of the gradient area GA in the first direction DR1 may be greater than that of the light blocking area BA. In some embodiments, the width of the gradient area GA in the first direction DR1 may be the same as or smaller than that of the light blocking area BA.

The light transmitting area TA, the gradient area GA, and the light blocking area BA may have a first light transmittance, a second light transmittance, and a third light transmittance, respectively. The second light transmittance and the third light transmittance may be smaller than the first light transmittance, and the second light transmittance may be greater than the third light transmittance. The range of the second light transmittance may be wider than the range of the first light transmittance and the range of the third light transmittance. For example, the first light transmittance may be in a range of about 0.7 to 1.0, the second light transmittance may be in a range of about 0.3 to 0.7, and the third light transmittance may be less than about 0.3.

The light transmittance variations of the light transmitting area TA and the light blocking area BA may be smaller than the light transmittance variation of the gradient area GA. In an embodiment, each of the light transmitting area TA and the light blocking area BA has a constant light transmittance or a substantially constant light transmittance. For example, the difference in the light transmittances of the opposite edge portions of the light transmitting area TA or the light blocking area BA may be in a range of about 0 to 0.3, and the difference in the light transmittances of the opposite edge portions of the gradient area GA may be in a range of about 0.4 to 1.0.

In an embodiment, the light blocking area BA, the gradient areas GA, and the light transmitting areas TA are arranged symmetrically with respect to the lens boundary BD, but are not limited thereto.

In some embodiments, the light transmittance of the light blocking area BA may vary according to a distance from the lens boundary BD, similarly to the light transmittance of the gradient area GA. In some embodiments, the optical filter 300 may include only the transmitting area and the gradient area GA between the light transmitting areas TA. The light transmittance of the gradient area GA may have a symmetric light transmittance distribution in which a transmittance value increases from the center having a minimum transmittance value to each of opposite ends having a maximum transmittance value. For example, the transmittance value continuously or discretely increase from the minimum transmittance value to the maximum transmittance value. The center of the symmetric light transmittance distribution may overlap or may be aligned to the lens boundary BD in the thickness direction. Each of the opposite ends of the symmetric light transmittance distribution may be adjacent to the light transmitting area TA.

The optical filter 300 may include a gradient light blocking member GM disposed in the lens boundary portion BDR and a light transmitting member TM disposed in the non-boundary portion NBDR. The gradient light blocking member GM may be provided in plural, and the light transmitting member TM may be provided in plural. The plurality of light blocking members GM and the plurality of transmitting members TM may be arranged alternately in the first direction DR1.

The plurality of the gradient light blocking members GM may respectively overlap the plurality of lens boundary portions BDR in the thickness direction. Each of the plurality of gradient light blocking members GM may overlap the light blocking area BA and both gradient areas GA adjacent to the opposite sides of the light blocking area BA. The gradient light blocking member GM may be disposed to overlap the black matrix BM arranged between the first sub-pixel SP1 and the third sub-pixel SP3 and/or the thin film transistor ST driving the first sub-pixel SP1, in the thickness direction.

The gradient light blocking member GM may have a symmetric light transmittance distribution in which a light transmittance value varies according to a distance from the lens boundary BD. The light transmittance of the gradient light blocking member GM may be distributed to have a gradient according to the distance from the lens boundary BD. In an embodiment, the light transmittance of the gradient light blocking member GM may gradually decrease closer to the lens boundary BD, and may gradually increase farther away from the lens boundary BD. In other words, the light blocking ratio of the gradient light blocking member GM may gradually increase closer to the lens boundary BD, and may gradually decrease farther away from the lens boundary BD. In an embodiment, the distribution of the light transmittance and/or a light blocking material of the gradient light blocking member GM may be symmetrical with respect to the lens boundary BD, but the present disclosure is not limited thereto.

The light transmittance of the gradient light blocking member GM may have a minimum value at a portion overlapping the lens boundary BD, and may gradually increase farther away from the lens boundary BD to have a maximum value at an edge portion in contact with the light transmitting member TM. For example, a portion of the gradient light blocking member GM disposed in the light blocking area BA may have a light transmittance less than about 0.3, and a portion of the gradient light blocking member GM disposed in the gradient area GA may have a light transmittance increasing from about 0.3 to about 0.7 as the distance from the lens boundary BD increases, but the present disclosure is not limited thereto. In some embodiments, the difference between the maximum value and the minimum value may be about 0.4 or more. In some embodiments, the maximum value may be substantially the same as the light transmittance of the light transmitting member TM. The light transmittance of the light transmitting member TM may be greater than about 0.7.

In some embodiments, the light transmittance of the gradient light blocking member GM may decrease with a constant slope. In some embodiments, the slope may decrease or increase as a distance from the lens boundary BD increases. In some embodiments, the slope may increase and then decrease, or vice versa, as the distance from the lens boundary BD increases.

In some embodiments, the gradient light blocking member GM may be referred to as a gradient transmitting member or a gradient absorbing member in which the light transmittance, the light blocking ratio, and/or the light absorption are distributed to have a gradient.

The gradient light blocking member GM may include a light blocking material.

The light blocking material may be a material that blocks and/or absorbs light. For example, the gradient light blocking member GM may be formed of an organic layer including a black dye or a black pigment, or may be formed of a metal layer including an opaque metal material such as chromium (Cr). The light blocking material may include a material that is the same as or similar to the material constituting the black matrix BM, but is not limited thereto. In an embodiment, the density of the light blocking material may increase closer to the lens boundary BD, and the density of the light blocking material may decrease farther away from the lens boundary BD. In some embodiments, the distribution of the light blocking material as described above may be implemented by a lithography process using a halftone mask or a printing process using an ink composition containing the light blocking material.

The gradient light blocking member GM may further include a base material. The base material may include a light transmissive material. The light transmittance of the light blocking member according to the distance from the lens boundary BD may be controlled by adjusting the ratio of the base material and the light blocking material. For example, the ratio of the light blocking material to the base material may increase closer to the lens boundary BD, and the ratio of the light blocking material to the base material may decrease farther away from the lens boundary BD. In some embodiments, the base material may include or may be formed of an organic material such as acryl resin, epoxy resin, phenolic resin, polyamide resin, polyimide resin and the like. In some embodiments, the base material may include or may be formed of an inorganic material. In some embodiments, the base material may include or may be formed of an adhesive material, for example, an optically clear adhesive (OCA) and/or an optically clear resin (OCR).

The light transmitting member TM may be disposed between the gradient light blocking members GM. The light transmitting member TM may be connected to the gradient light blocking members GM. The light transmitting member TM may be disposed in the light transmitting area TA. The light transmitting member TM may transmit most of light emitted from the display panel 100. In an embodiment, the light transmitting member TM may have a constant light transmittance regardless of a distance from the lens boundary BD.

The light transmitting member TM may include or may be formed of a light transmissive material. The light transmitting member TM may include or may be formed of an organic material such as acryl resin, epoxy resin, phenolic resin, polyamide resin, polyimide resin and the like. In some embodiments, the light transmitting member TM may include an inorganic material. In some embodiments, the light transmitting member TM may include an adhesive material, for example, OCA and/or OCR. In some embodiments, the light transmitting member TM may be replaced with an air layer and/or an air gap.

The light transmitting member TM may cover a side surface between one surface of the gradient light blocking member GM facing the first substrate SUB1 and the other surface of the gradient light blocking member GM facing the lens array 200. In some embodiments, the light transmitting member TM may be disposed between the gradient light blocking member GM and the first substrate SUB1 to cover the one surface of the gradient light blocking member GM. In some embodiments, the light transmitting member TM may be disposed between the lens array 200 and the gradient light blocking member GM to cover the other surface of the gradient light blocking member GM. The light transmitting member TM may be disposed to overlap the black matrix BM arranged between the first sub-pixel SP1 and the second sub-pixel SP2, the black matrix BM arranged between the second sub-pixel SP2 and the third sub-pixel SP3, the first emission area EA1, the second emission area EA2, the third emission area EA3, the thin film transistor ST driving the second sub-pixel SP2 and/or the thin film transistor ST driving the third sub-pixel SP3, in the thickness direction.

The light transmitting area TA, the gradient area GA, and the light blocking area BA may be defined by the light transmitting member TM and the gradient light blocking member GM. The light blocking area BA may be an area where the center portion of the gradient light blocking member GM adjacent to the lens boundary BD is disposed, the gradient area GA may be an area where the edge portion of the gradient light blocking member GM is disposed, and the light transmitting area TA may be an area where the light transmitting member TM is disposed. The center portion of the gradient light blocking member GM may be disposed to overlap the black matrix in the thickness direction. In some embodiments, the center portion of the gradient light blocking member GM may block most of light incident thereto and have a substantially constant light transmittance. The edge portions of the gradient light blocking member GM may have a light transmittance increasing farther away from the lens boundary BD. For example, the light transmittance at the edge portions of the gradient light blocking member GM may increase continuously or discretely farther away from the lens boundary BD.

Referring to FIG. 5, the gradient light blocking member GM and the light transmitting member TM may be arranged in the shape of stripes extending in the second direction DR2 in a plan view. In an embodiment, the width of the gradient light blocking member GM may be smaller than the width of the light transmitting member TM in the first direction DR1. In some embodiments, the gradient light blocking member GM and the light transmitting member TM may have the same length in the second direction DR2, but may have different widths in the first direction DR1. However, the present disclosure is not limited thereto.

Referring to the right drawing of FIG. 5, the gradient light blocking member GM may have a plurality of regions that are disposed in the shape of stripes in a plan view and have different light transmittances. In the following, to describe a gradational distribution of the light transmittance, a first region GM1, a second region GM2, and a third region GM3 are exemplified as the plurality of regions, but the arrangement and the number of the regions are not limited thereto.

The first region GM1 may be disposed to overlap the lens boundary BD. The first region GM1 may be disposed in the light blocking area BA. The first region GM1 may have the lowest light transmittance. For example, the light transmittance of the first region GM1 may be in a range of about 0.3 to 0.4.

The second and third regions GM2 and GM3 may be disposed in the gradient area GA. The second regions GM2 may be disposed on opposite sides of the first region GM1 in the second direction DR2. The second region GM2 may have a higher light transmittance than the first region GM1. For example, the light transmittance of the second region GM2 may be in a range of about 0.4 to 0.6. The third region GM3 may be disposed between the second region GM2 and the light transmitting member TM. The third regions GM3 may be arranged to surround the first region GM1 and the second region GM2. The third region GM3 may have a higher light transmittance than the second region GM2. For example, the light transmittance of the third region GM3 may be in a range of about 0.6 to 0.8. The light transmittance of the light transmitting member TM may be in a range of about 0.8 to 1.0.

In an embodiment, although the gradient light blocking member GM is divided into the plurality of regions according to the light transmittance, the light transmittance of the gradient light blocking member GM may be continuously varied over the plurality of regions. In some embodiments, the light transmittance of the gradient light blocking member GM may be discretely varied corresponding to the respective regions.

Referring to FIGS. 4 and 5, the gradient light blocking members GM of the display device 10 according to an embodiment may be disposed at predetermined intervals for the respective lens boundaries BD, thereby reducing diffraction generated at the lens boundary portions BDR. However, when the gradient light blocking member GM has a constant light transmittance and/or a constant light blocking ratio, another diffraction may occur due to a slit generated by the gradient light blocking member GM. Accordingly, the gradient light blocking member GM may have a light transmittance increasing farther away from the lens boundary BD so as to have soft edges, thereby preventing another diffraction described above. The gradient light blocking member GM and the light transmitting member TM may form an apodization slit and/or an apodization pattern, thereby reducing diffraction of light occurring in the lens boundary portion BDR.

Figure 6:
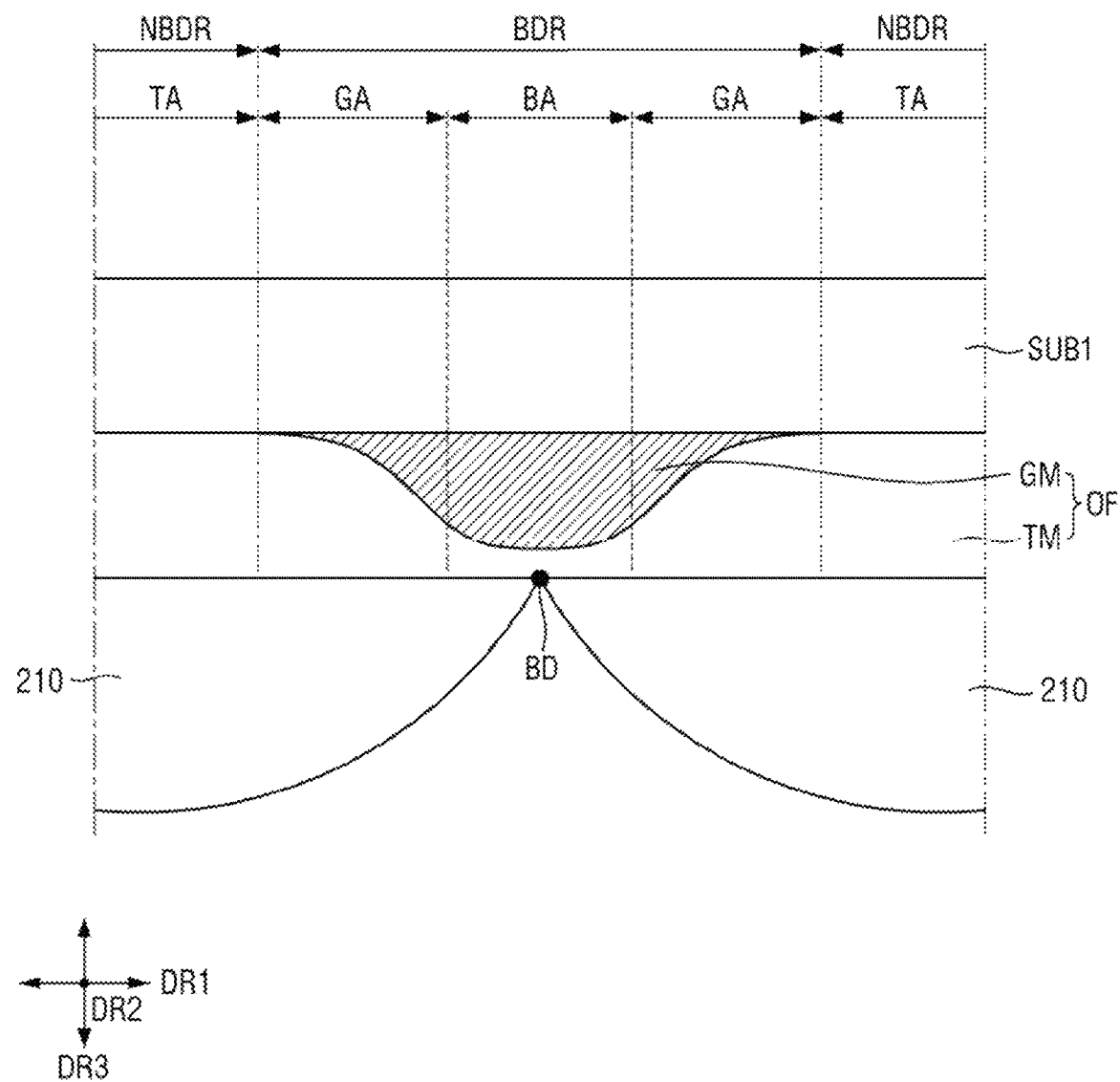
FIG. 6 is a cross-sectional view of an optical filter of a display device according to an embodiment of the present invention.

FIG. 6 is a cross-sectional view of an optical filter of a display device according to an embodiment.

The embodiment of FIG. 6 is different from the embodiment of FIGS. 1 to 5 in arrangements and shapes of a gradient light blocking member GMa and a light transmitting member TMa.

Referring to FIG. 6, the gradient light blocking member GMa may be formed on the other surface of the first substrate SUB1. For example, the gradient light blocking member GMa may be formed through a lithography process using a halftone mask. In some embodiments, the gradient light blocking member GMa may be formed above one surface of the lens array 200.

The gradient light blocking member GMa may be disposed in the lens boundary portion BDR to overlap the lens boundary BD. The gradient light blocking member GMa may be disposed over the light blocking area BA and the gradient area GA. In some embodiments, a portion of the gradient light blocking member GMa may be disposed over the gradient area GA and the light transmitting area TA.

Unlike the embodiment of FIGS. 1 to 5, the light blocking material may be distributed in the gradient light blocking member GMa at a uniform density, while it may be arranged to have a thickness which varies according to a distance from the lens boundary BD. Specifically, the thickness of the gradient light blocking member GMa may gradually decrease farther away from the lens boundary BD. The thickness of the gradient light blocking member GMa in the light blocking area BA may be greater than the thickness thereof in the gradient area GA. The thickness of the gradient light blocking member GMa may be maximum at the light blocking area BA and/or the lens boundary BD, and may be minimum at the edge portion of the gradient area GA adjacent to the light transmitting area TA. Accordingly, the light transmittance of the gradient light blocking member GMa may be maximum at an edge portion adjacent to the light transmitting area TA, and may be minimum at a portion overlapping the lens boundary BD. In an embodiment, the gradient light blocking member GMa may have a shape symmetrical with respect to the lens boundary BD, but is not limited thereto.

The gradient light blocking member GMa may include one surface facing the first substrate SUB1 and the other surface opposite to the one surface.

The other surface of the gradient light blocking member GMa in the gradient area GA may be inclined with respect to the other surface of the first substrate SUB1 and/or one surface of the lens array 200 facing the first substrate SUB1. The other surface of the gradient light blocking member GMa may be a surface that faces the one surface of the lens array 200. The other surface of the gradient light blocking member GMa may be both side surfaces of the gradient light blocking member GMa. In an embodiment, the slopes of both side surfaces of the gradient light blocking member GMa may become smaller farther away from the lens boundary BD. In some embodiments, the slopes of both side surfaces of the gradient light blocking member GMa may be constant or may become greater farther away from the lens boundary BD. In some embodiments, the both side surfaces of the gradient light blocking member GMa may be formed to have at least one stepped portion.

The width of the gradient light blocking member GMa in the first direction DR1 may vary according to a distance from the first substrate SUB1 in the third direction DR3. In an embodiment, the width of the gradient light blocking member GMa in the first direction DR1 may decrease farther away from the first substrate SUB1. Alternatively, in some embodiments, the width of the gradient light blocking member GMa in the first direction DR1 may increase farther away from the first substrate SUB1.

Unlike the embodiment of FIGS. 1 to 5, the light transmitting member TMa may be arranged as one layer over the lens boundary portion BDR and the non-boundary portion NBDR. The light transmitting member TMa may be disposed to cover one surface of the gradient light blocking member GMa facing the lens array 200. The gradient light blocking member GMa may be spaced apart from the one surface of the lens array 200. The light transmitting member TMa may be disposed between the gradient light blocking member GMa and the lens array 200 in the lens boundary portion BDR of the lens array 200.

Since the embodiment of FIG. 6 is substantially the same as or similar to the embodiment of FIGS. 1 to 5 except for the arrangements and the shapes of the gradient light blocking member GM and the light transmitting member TM, a redundant description will be omitted.

Figure 7:
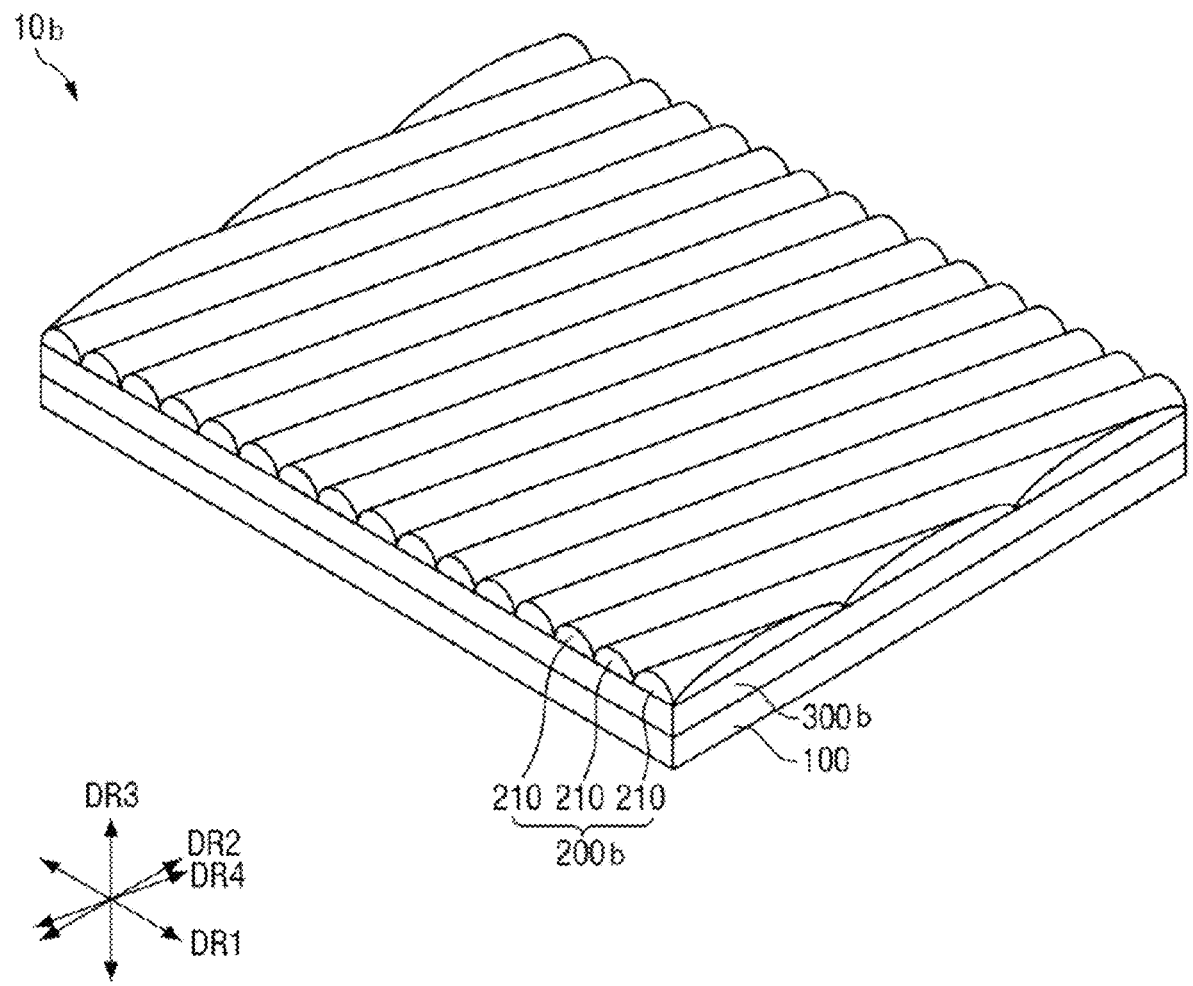
FIG. 7 is a perspective view of a display device according to an embodiment of the present invention.
Figure 9:
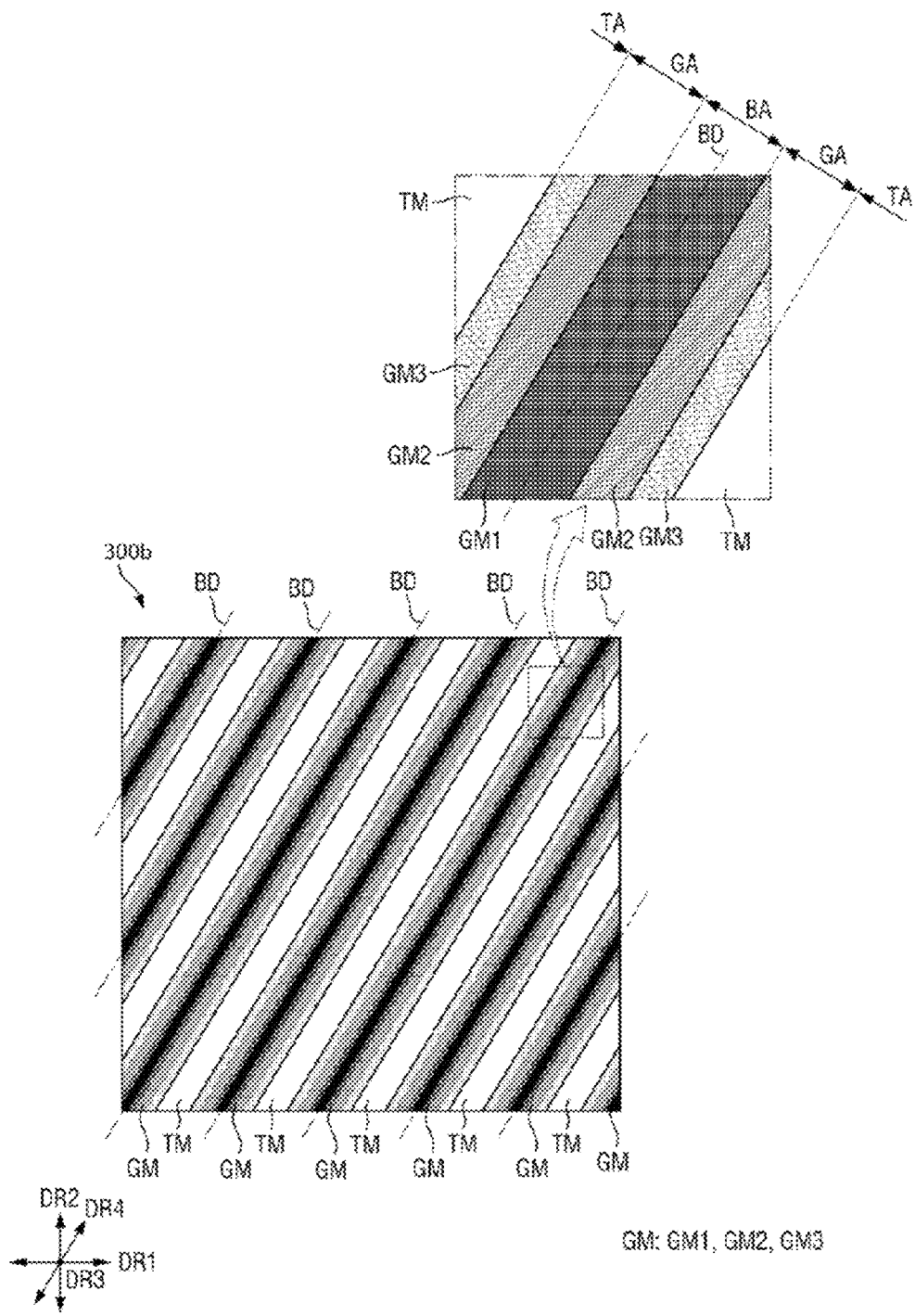
FIG. 9 is a plan view of an optical filter of the display device of FIG. 7 according to an embodiment of the present invention.

FIG. 7 is a perspective view of a display device according to an embodiment. FIG. 8 is a plan view conceptually illustrating a plurality of lenses and pixels of the display device of FIG. 7. FIG. 9 is a plan view of an optical filter of the display device of FIG. 7.

The embodiment of FIGS. 7 to 9 is different from the embodiment of FIGS. 1 to 5 in that the plurality of lenses 210 constituting a lens array 200b, the gradient light blocking member GM, and the light transmitting member TM are arranged to be inclined with respect to the first direction DR1 and/or the second direction DR2.

Referring to FIG. 7, the display device 10 may include the display panel 100, the lens array 200b and an optical filter 300b.

The display device 10 may have an approximately rectangular shape in a plan view. The display device 10 may include both long sides extending in the first direction DR1 and both short sides extending in the second direction DR2, respectively.

Unlike the embodiment of FIGS. 1 to 5, the plurality of lenses 210 constituting the lens array 200b may extend in a fourth direction DR4 intersecting the first direction DR1 and/or the second direction DR2 in a plan view. For example, the lens array 200b may include both long sides extending in the first direction DR1 and both short sides extending in the second direction DR2, but the plurality of lenses 210 constituting the lens array 200b may be disposed to be inclined with respect to the first direction DR1 and the second direction DR2.

Referring to FIG. 8, the lens boundary portion BDR and the non-boundary portion NBDR may be arranged in the shape of stripes extending in the fourth direction DR4 in a plan view. For example, each of the first, second and third sub-pixels SP1, SP2 and SP3 may have a rectangular shape in a plan view having short sides in the first direction DR1 and long sides in the second direction DR2. In the pixel PX, the first sub-pixel SP1, the second sub-pixel SP2, and the third sub-pixel SP3 may be arranged in the first direction DR1. As described above, since the plurality of lenses 210 constituting the lens array 200b are arranged to extend in the fourth direction DR4, the lens boundary BD between the lenses 210, the lens boundary portion BDR, and the non-boundary portion NBDR may be disposed to be inclined in the fourth direction DR4 with respect to the long sides of the first, second and third sub-pixels SP1, SP2 and SP3.

Referring to FIG. 9, as the lenses 210 and the lens boundary BD are arranged to extend in the fourth direction DR4, the gradient light blocking member GM and the light transmitting member TM may be arranged in the shape of stripes extending in the fourth direction DR4 in a plan view. The first, second and third regions GM1, GM2, and GM3 of the gradient light blocking member GM may also be arranged in the shape of stripes extending in the fourth direction DR4 to be parallel with the lens boundary BD.

The light transmittance of the gradient light blocking member GM may vary according to the distance from the lens boundary BD. The distance may be a distance in at least one direction perpendicular to the fourth direction DR4.

Since the embodiment of FIGS. 7 to 9 is substantially the same as or similar to the embodiment of FIGS. 1 to 5 except that the plurality of lenses 210, the gradient light blocking member GM, and the light transmitting member TM are arranged to be inclined with respect to the first direction DR1 and/or the second direction DR2, a redundant description will be omitted below.

Figure 10:
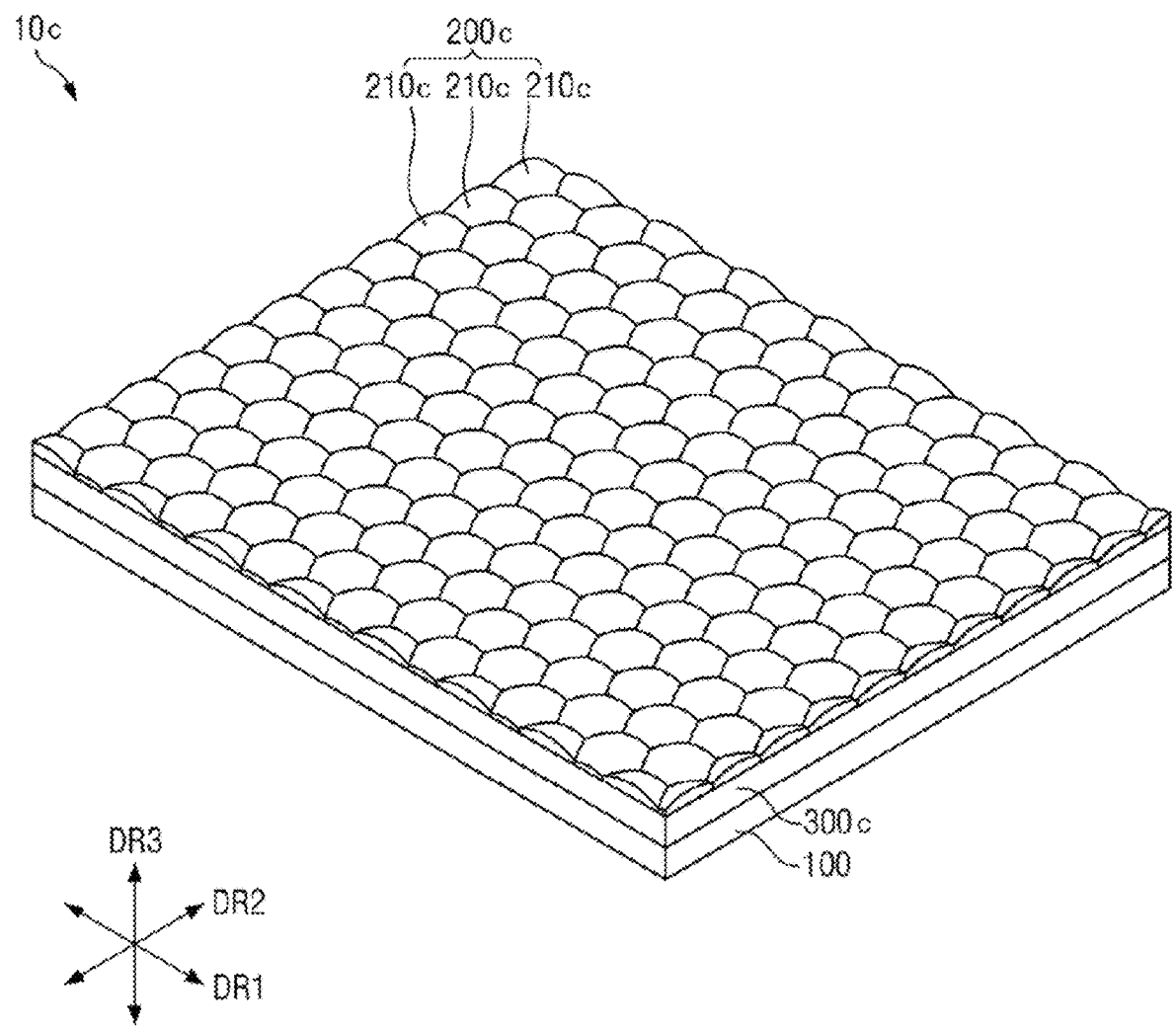
FIG. 10 is a perspective view of a display device according to an embodiment of the present invention.
Figure 11:
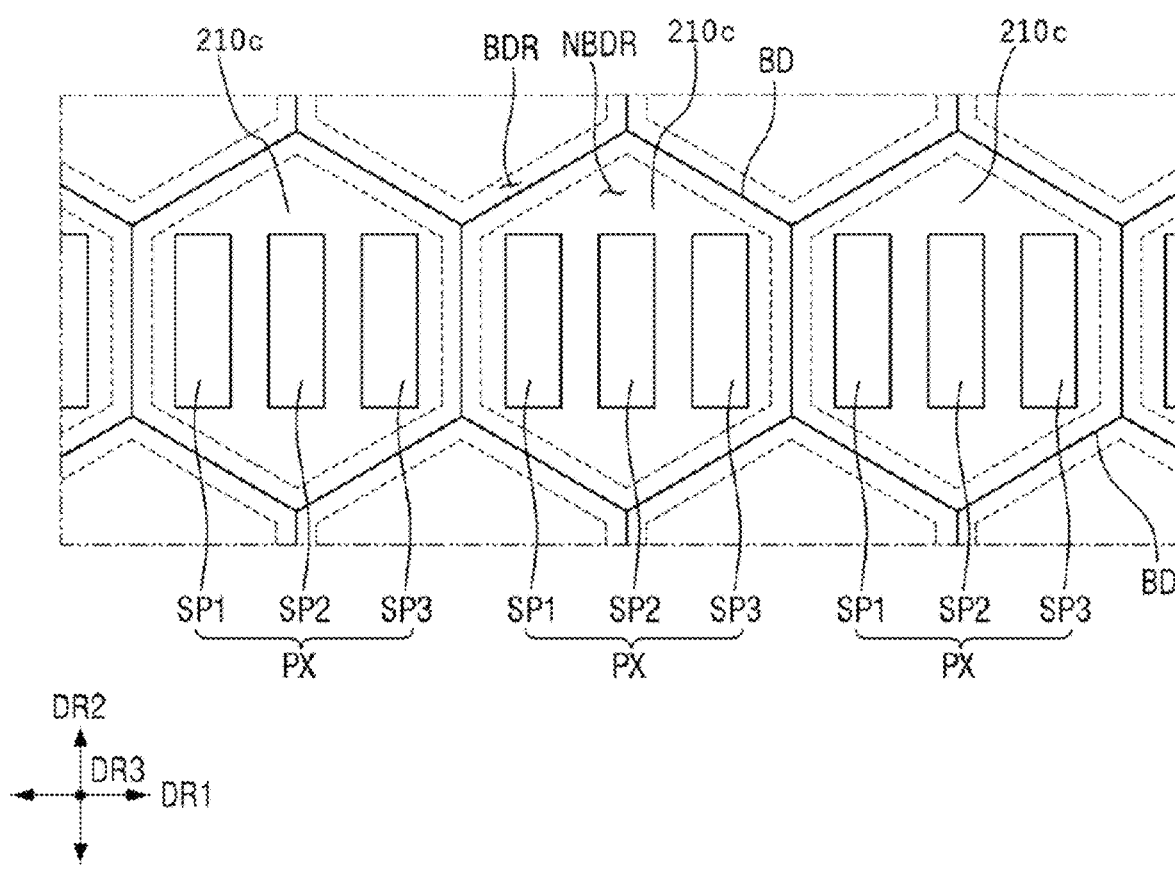
FIG. 11 is a plan view conceptually illustrating a plurality of lenses and pixels of the display device of FIG. 10 according to an embodiment of the present invention.
Figure 12:
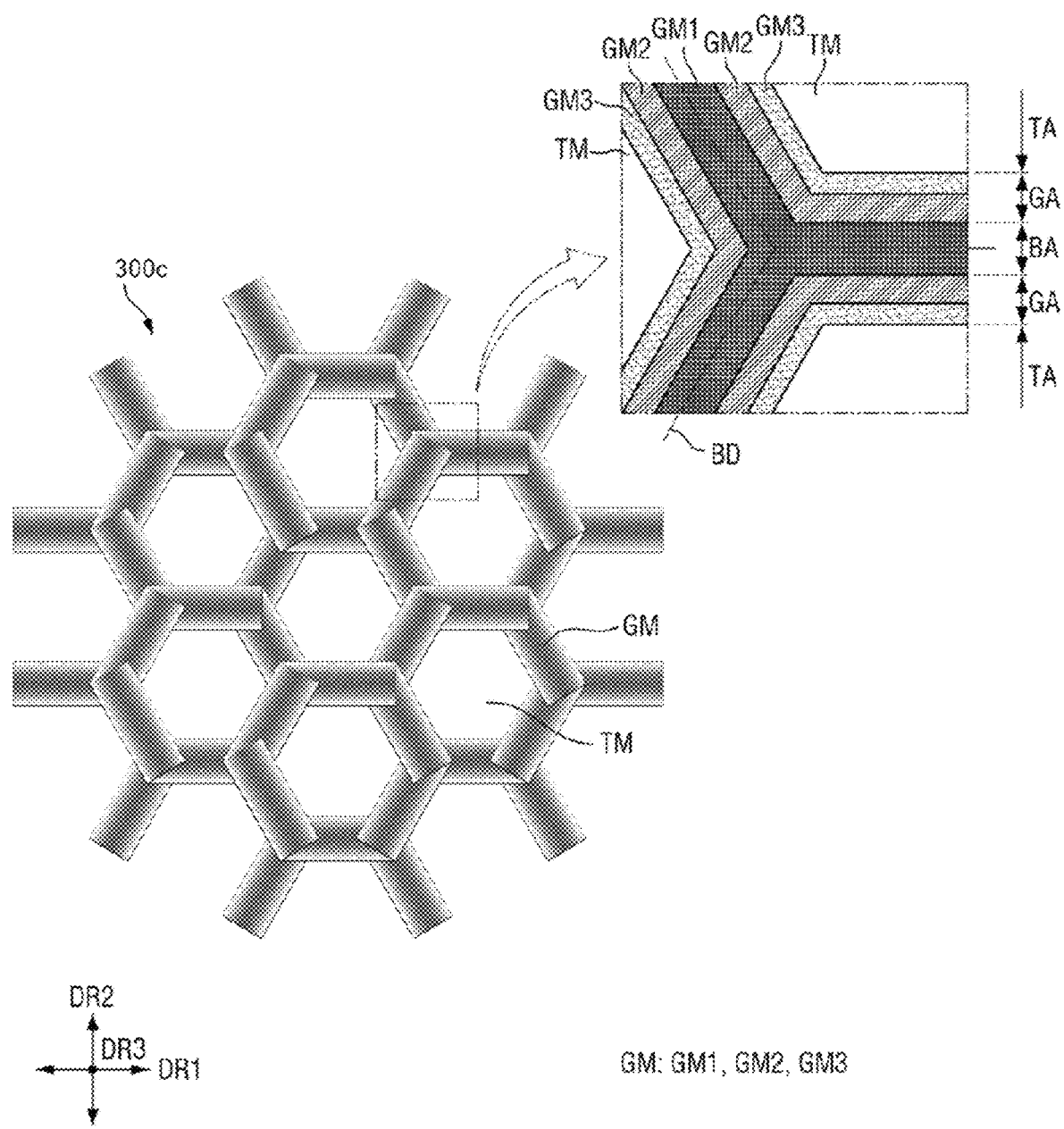
FIG. 12 is a plan view of an optical filter of the display device of FIG. 10 according to an embodiment of the present invention.

FIG. 10 is a perspective view of a display device according to an embodiment. FIG. 11 is a plan view conceptually illustrating a plurality of lenses and pixels of the display device of FIG. 10. FIG. 12 is a plan view of an optical filter of the display device of FIG. 10.

The embodiment of FIGS. 10 to 12 is different from the embodiment of FIGS. 1 to 5 in shapes of a plurality of lenses 210c, the gradient light blocking member GM, and the light transmitting member TM.

Referring to FIGS. 10 and 11, the display device 10 may include the display panel 100, a lens array 200c, and an optical filter 300c.

Unlike the embodiment of FIGS. 1 to 5, the plurality of lenses 210c constituting the lens array 200c may be hemispherical lenses and/or hemiellipsoidal lenses. The lenses 210c may be arranged in a matrix fashion in the first direction DR1 and the second direction DR2.

Referring to FIG. 11, each of the lenses 210c may have a hexagonal shape in a plan view. Accordingly, the lens boundary BD and the lens boundary portion BDR may also be arranged in a hexagonal grid shape in a plan view. The non-boundary portion NBDR may be arranged in an island shape to be surrounded by the lens boundary portion BDR in a plan view. In some embodiments, each of the lenses 210c may have a rectangular, circular, or elliptical shape in a plan view, and the lens boundary BD may also have a rectangular, circular or elliptical grid shape in a plan view.

In each of the lenses 210c, the first sub-pixel SP1, the second sub-pixel SP2, and the third sub-pixel SP3 may be arranged in the first direction DR1. The first sub-pixel SP1 may be disposed adjacent to a first side of the lens 210c, the second sub-pixel SP2 may be disposed in the center of the lens 210c, and the third sub-pixel SP3 may be disposed adjacent to a second side of the lens 210c. For example, as shown in FIG. 11, the first side of the lens 210c may be the left side of the lens 210c, and the second side of the lens 210c may be the right side of the lens 210c.

Referring to FIG. 12, the gradient light blocking member GM may be disposed in the grid-shaped lens boundary portion BDR in a plan view. The gradient light blocking members GM may be arranged in the hexagonal grid shape in a plan view. The gradient light blocking member GM may be disposed to surround the light transmitting member TM. At a point where the three lenses 210c meet each other, the gradient light blocking member GM may have branches ramified in a Y shape. The light transmitting member TM may be arranged in the island shape in the non-boundary portion NBDR, and thus may be surrounded by the gradient light blocking member GM, in a plan view.

The light transmittance of the optical filter 300c may increase toward the center of each lens 210c from the lens boundary BD. The edge portion of the gradient light blocking member GM, which is disposed adjacent to the center of each lens 210c, may have a light transmittance higher than the center portion of the gradient light blocking member GM which overlaps the lens boundary BD. For example, the first region GM1, the second region GM2, and the third region GM3 of the gradient light blocking member GM may be sequentially arranged from the lens boundary BD toward the center of each lens 210c.

Since the embodiment of FIGS. 10 to 12 is substantially the same as or similar to the embodiment of FIGS. 1 to 5 except for the shapes of the lenses 210c, the gradient light blocking member GM, and the light transmitting member TM, a redundant description will be omitted below.

Figure 13:
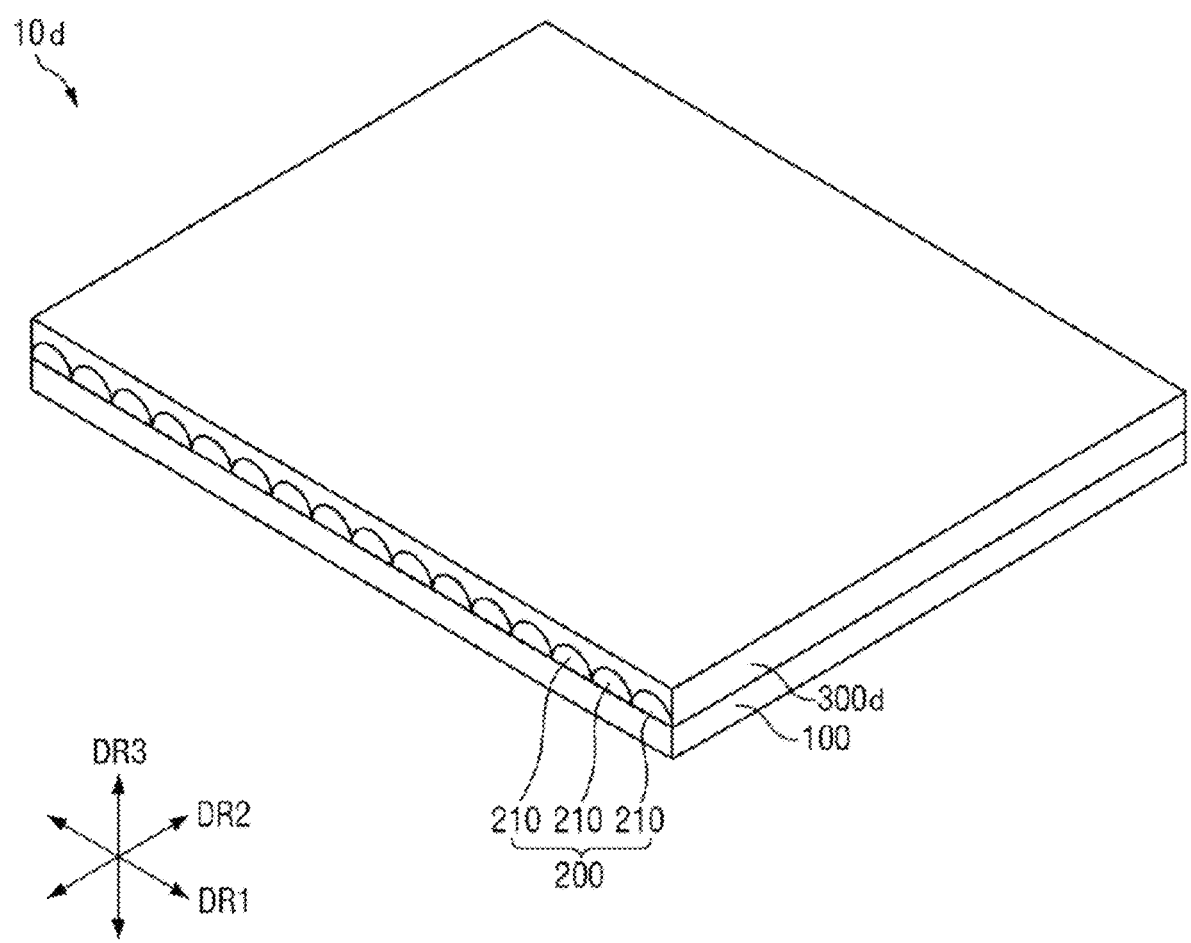
FIG. 13 is a perspective view of a display device according to an embodiment of the present invention.
Figure 14:
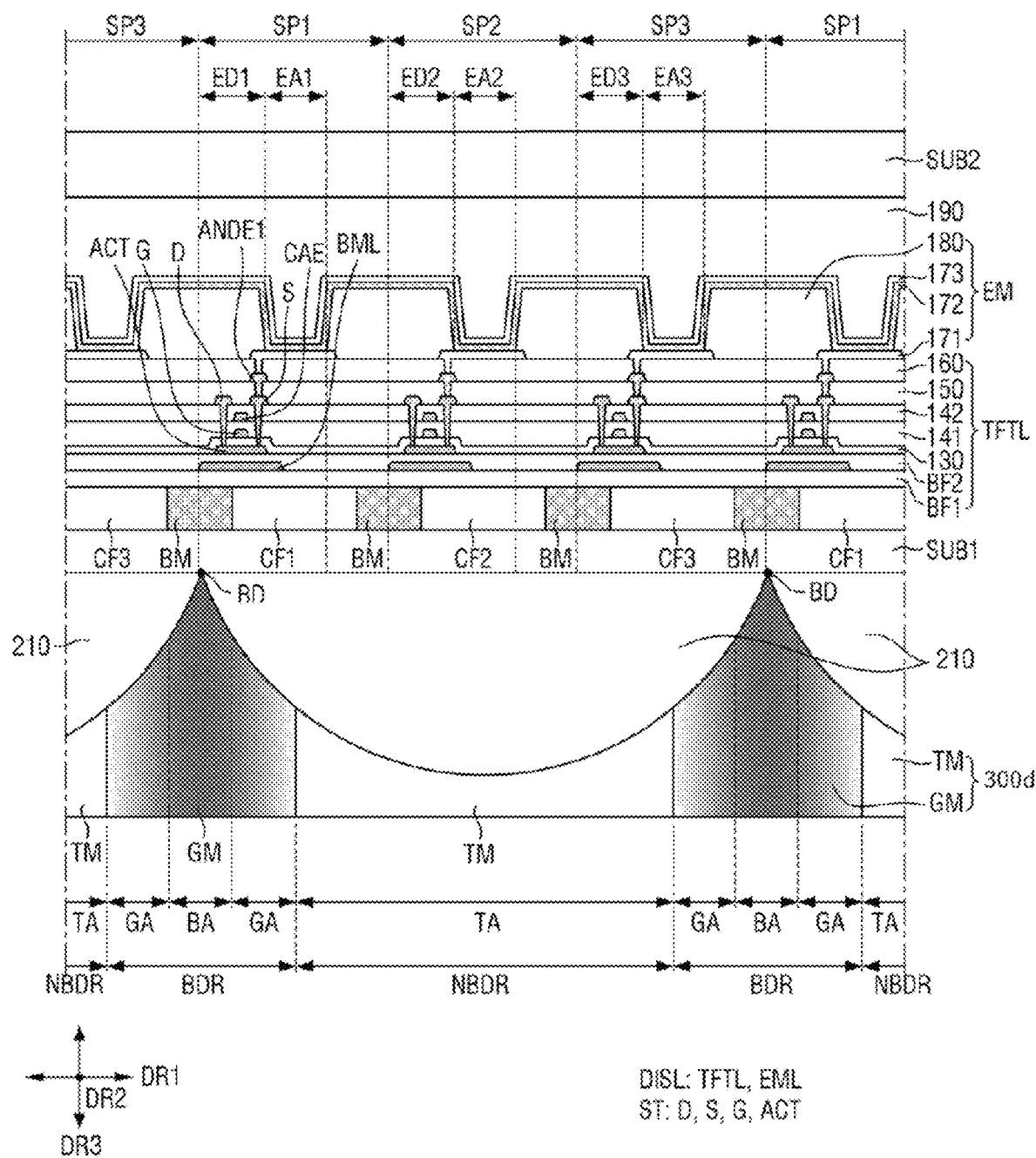
FIG. 14 is a cross-sectional view of the display device of FIG. 13 according to an embodiment of the present invention.

FIG. 13 is a perspective view of a display device according to an embodiment. FIG. 14 is a cross-sectional view of the display device of FIG. 13.

The embodiment of FIGS. 13 and 14 is different from the embodiment of FIGS. 1 to 5 in that an optical filter 300d is disposed on the other surface of the lens array 200.

Referring to FIG. 13, the lens array 200 may be disposed between the optical filter 300d and the display panel 100. The optical filter 300d may be disposed on the other surface of the lens array 200, which is opposite to one surface of the lens array 200 facing the display panel 100. The optical filter 300d may gradually block light, which is diffracted by the lens boundary portion BDR, according to the distance from the lens boundary BD, thereby decreasing the diffraction of light occurring at the lens boundary portion BDR.

Referring to FIGS. 13 and 14, at one surface of the optical filter 300d facing the lens array 200, an uneven portion of the optical filter 300d may be formed to correspond to the shapes of the lenses 210. The other surface of the optical filter 300d, which is opposite to the one surface thereof, may be formed to be flat.

The optical filter 300d may function as a planarization layer that covers the other surface of the lens array 200. The optical filter 300d may have a refractive index lower than the refractive index of the lens 210.

The optical filter 300d may include the gradient light blocking member GM disposed in the lens boundary portion BDR and the light transmitting member TM disposed in the non-boundary portion NBDR. Similarly to FIG. 5, the gradient light blocking member GM and the light transmitting member TM may be arranged in the shape of stripes extending in the second direction DR2 in a plan view.

One surface of the gradient light blocking member GM may have a shape corresponding to the lens boundary portion BDR. The gradient light blocking member GM may be arranged to fill a gap between the lenses. The gradient light blocking member GM may have a protrusion at one surface, which protrudes toward the first substrate SUB1.

Figure 15:
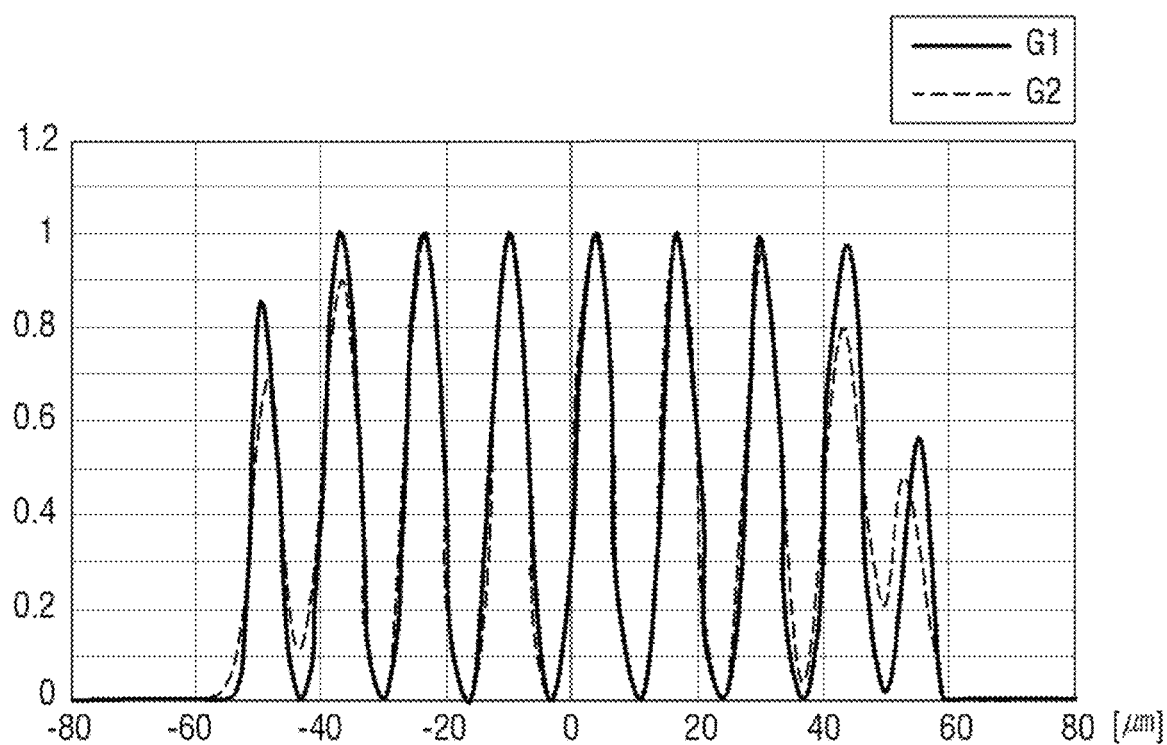
FIG. 15 illustrates a graph obtained from an experiment in which luminance for each position of one lens in the case where an optical filter of a display device according to an embodiment of the present invention is applied is compared with luminance for each position of one lens in the case where the above-described optical filter is not applied.

FIG. 15 illustrates a graph obtained from an experiment in which luminance for each position of one lens in the case where an optical filter of a display device according to an embodiment is applied is compared with luminance for each position of one lens in the case where the above-described optical filter is not applied.

In FIG. 15, the horizontal axis of the graph indicates a measurement position, and the vertical axis of the graph indicates relative luminance. The first graph G1 represents the luminance measured in the case where the optical filter 300 is applied. The second graph G2 represents luminance measured in the case where the optical filter 300 is not applied. Each peak of the first graph G1 and the second graph G2 may correspond to light emitted from one sub-pixel. Nine sub-pixels are exemplified in FIG. 15. Approximately, a main lobe of the graph, for example, a portion corresponding to the range of −30 μm to 30 μm with respect to the center of the lens in the horizontal axis of the graph may be the center portion of the lens 210 (non-boundary portion NBDR), and side lobes of the graph, for example, portions corresponding to the range of −30 μm to −60 μm and the range of 30 μm to 60 μm in the horizontal axis of the graph may be the edge portions of the lens 210 (lens boundary portions BDR).

Referring to FIG. 15, when the optical filter 300 is applied, uniformity of luminance of light emitted from the display device 10 may be improved, and crosstalk at the side lobes of the graph may be reduced. Accordingly, it is possible to uniformly adjust the luminance of a plurality of view images having different viewing angles, and obtain view images with improved quality. Spherical aberration and/or coma aberration of the lens 210 may also be decreased by the apodization slit formed by the gradient light blocking member GM and the light transmitting member TM.

In concluding the detailed description, those skilled in the art will appreciate that many variations and modifications may be made to the embodiments without substantially departing from the principles of the present invention. Therefore, the disclosed embodiments of the invention are used in a generic and descriptive sense only and not for purposes of limitation.

What is claimed is:

1. A display device comprising:
   a display panel;
   a lens array disposed on a first surface of the display panel and including a plurality of lenses; and
   an optical filter disposed on the first surface of the display panel,
   wherein the optical filter includes a plurality of first portions and a plurality of second portions which are alternately arranged in a first direction parallel to the first surface of the display panel,
   wherein each of the plurality of first portions has a first transmittance value, and
   wherein each of the plurality of second portions has a symmetric light transmittance distribution in which a transmittance value increases from the center having a second transmittance value to each of opposite ends having a third transmittance value.

2. The display device of claim 1,
   wherein the center of the symmetric light transmittance distribution of each of the plurality of second portions is aligned to a lens boundary between two adjacent lenses of the plurality of lenses in a thickness direction.

3. The display device of claim 2,
   wherein each of the plurality of first portions has a constant transmittance value of the first transmittance value.

4. The display device of claim 3,
   wherein the second transmittance value is smaller than the first transmittance value.

5. The display device of claim 4,
   wherein the second transmittance value is greater than 0 and less than 0.3, and
   wherein the third transmittance value is greater than 0.7 and less than 1.0.

6. The display device of claim 4,
   wherein each of the plurality of first portions includes a first end connected to one of two adjacent second portions of the plurality of second portions and a second end connected to the other of the two adjacent second portions of the plurality of second portions, and
   wherein the third transmittance value is equal to the first transmittance value.

7. The display device of claim 1,
   wherein the plurality of second portions of the optical filter corresponds to an apodization slit.

8. The display device of claim 1,
wherein each of the plurality of second portions of the optical filter includes a light blocking material, and
wherein a density of the light blocking material gradually increases from the center to each of the opposite ends.

9. The display device of claim 1,
wherein the lens array includes a plurality of lens boundary portions and a plurality of non-boundary portions which are alternately arranged in the first direction,
wherein each of the plurality of lens boundary portions includes edge portions of two adjacent lenses of the plurality of lenses,
wherein each of the plurality of non-boundary portions overlaps a corresponding one of the plurality of first portions of the optical filter, and
wherein each of the plurality of boundary portions overlaps a corresponding one of the plurality of second portions of the optical filter.

10. The display device of claim 9,
wherein each of the plurality of lens boundary portions has a width ranging from 3 μm to 5 μm, and
wherein each of the plurality of lenses has a width ranging from 100 μm to 140 μm.

11. The display device of claim 9,
wherein each of the plurality of lens boundary portions is configured to diffract light which is received from the display panel.

12. The display device of claim 1,
wherein the lens array is a lenticular lens.

13. The display device of claim 12,
wherein when the display device is viewed in a plan view, the plurality of second portions of the optical filter are arranged to have a stripe shape which extends in a second direction different from the first direction.

14. The display device of claim 13,
wherein the display panel includes a plurality of subpixels which are arranged in the first direction and a third direction different from the first direction,
wherein the third direction is different from the second direction, and
wherein the first direction, the second direction, and the third direction are on the same plane which is parallel to the first surface of the display panel.

15. The display device of claim 1,
wherein the plurality of lenses are arranged in a matrix fashion to form a micro-lens array.

16. The display device of claim 15,
wherein when the display device is viewed in a plan view, each of the plurality of lenses has a hexagonal shape, and
wherein when the display device is viewed in a plan view, the plurality of second portions of the optical filter are arranged in a hexagonal grid shape.

17. The display device of claim 1,
wherein the optical filter is interposed between the display panel and the lens array.

18. The display device of claim 1,
wherein the lens array is interposed between the display panel and the optical filter.

19. The display device of claim 1,
wherein the display panel includes a plurality of color filters and a plurality of black matrixes which are alternately arranged in the first direction, and
wherein each of the plurality of second portions of the optical filter overlaps a corresponding one of the plurality of black matrixes.

20. The display device of claim 19,
wherein the plurality of black matrixes includes a plurality of first black matrixes and a plurality of second black matrixes,
wherein each of the plurality of first black matrixes overlaps a corresponding one of the plurality of second portions of the optical filter, and
wherein each of the plurality of second black matrixes overlaps a corresponding one of the plurality of first portions of the optical filter.

21. A display device comprising:
a display panel;
a lens array disposed on a first surface of the display panel and including a plurality of lenses; and
an optical filter disposed on the first surface of the display panel and including a light blocking area overlapping a first lens boundary between two adjacent lenses of the plurality of lenses in a thickness direction, a light transmitting area disposed between the first lens boundary and a second lens boundary adjacent to the first lens boundary, and a gradient area disposed between the light blocking area and the light transmitting area,
wherein the gradient area of the optical filter has a light transmittance value which varies according to a distance from the first lens boundary toward the second lens boundary.

22. The display device of claim 21,
wherein the gradient area has a minimum light transmittance value at one side adjacent to the light blocking area and a maximum light transmittance value at the other side adjacent to the light transmitting area.

* * * * *